US007389190B2

(12) United States Patent
Umemura et al.

(10) Patent No.: US 7,389,190 B2
(45) Date of Patent: Jun. 17, 2008

(54) TESTING APPARATUS FOR TESTING A DEVICE UNDER TEST AND COMPARATOR CIRCUIT AND CALIBRATION APPARATUS FOR THE TESTING APPARATUS

(75) Inventors: Yoshiharu Umemura, Tokyo (JP); Toshiyuki Okayasu, Tokyo (JP); Toshiaki Awaji, Tokyo (JP); Masahiro Yamakawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/569,654

(22) PCT Filed: Sep. 8, 2004

(86) PCT No.: PCT/JP2004/013065

§ 371 (c)(1),
(2), (4) Date: Feb. 24, 2006

(87) PCT Pub. No.: WO2005/026759

PCT Pub. Date: Mar. 24, 2005

(65) Prior Publication Data

US 2006/0267637 A1 Nov. 30, 2006

(30) Foreign Application Priority Data

Sep. 9, 2003 (JP) .............................. 2003-316484

(51) Int. Cl.
*G06F 19/00* (2006.01)
(52) U.S. Cl. .......................................... 702/64; 702/85
(58) Field of Classification Search ............ 702/64–66, 702/71, 85; 324/89, 612; 327/236, 77, 170, 327/63; 340/146.2
See application file for complete search history.

(56) References Cited

U.S. PATENT DOCUMENTS 4,807,147 A * 2/1989 Halbert et al. ................ 702/66

(Continued)

FOREIGN PATENT DOCUMENTS

JP 4-87988 3/1992

(Continued)

OTHER PUBLICATIONS

Broekaert et al., 'A Monolithic 4-Bit, 4-Gsps Resonant Tunneling Analog-to-Digital Converter', Sep. 1998, IEEE Publication, vol. 33, No. 9, pp. 1342-1349.*

(Continued)

*Primary Examiner*—Edward Raymond
*Assistant Examiner*—Elias Desta
(74) *Attorney, Agent, or Firm*—David N. Lathrop, Esq.; Gallagher & Lathrop

(57) ABSTRACT

There is provided a testing apparatus for testing a device under test, wherein the testing apparatus is provided with a timing generator for generating a timing signal indicating the timing at which a test signal is applied; a plurality of timing delay units for delaying the timing signal; a plurality of drivers for applying the delayed test signals; a sampler for sampling the test signal and outputting a sample voltage; a comparator for outputting a comparison result indicating whether the sample voltage is higher than the reference voltage; a determination part for determining whether the sample voltage matches the reference voltage; and a timing calibration part for calibrating the delay time caused in the timing signal by the plurality of timing delay units in order to synchronize the timing at which the test signals are applied to the device under test.

18 Claims, 17 Drawing Sheets

U.S. PATENT DOCUMENTS

| | | | |
|---|---|---|---|
| 4,929,888 A | 5/1990 | Yoshida | |
| 4,958,234 A * | 9/1990 | Yamaguchi et al. | 386/21 |
| 5,194,818 A * | 3/1993 | Scheibner | 324/617 |
| 5,635,864 A * | 6/1997 | Jones | 327/77 |
| 5,652,712 A * | 7/1997 | Szczebak et al. | 702/85 |
| 6,131,074 A | 10/2000 | Kawai | |
| 6,242,899 B1 * | 6/2001 | Miller | 324/76.24 |
| 6,281,699 B1 | 8/2001 | Bishop | |
| 6,401,225 B1 | 6/2002 | Miura | |
| 6,469,514 B2 * | 10/2002 | Okayasu | 324/532 |
| 7,107,815 B2 | 9/2006 | Ibane | |
| 2004/0173003 A1 | 9/2004 | Ibane | |

FOREIGN PATENT DOCUMENTS

| | | |
|---|---|---|
| JP | 5-256872 | 10/1993 |
| JP | 2517456 | 4/1996 |
| JP | 2000-199781 | 7/2000 |
| JP | 2000-314764 | 11/2000 |
| JP | 2000-352578 | 12/2000 |
| JP | 2003-114253 | 4/2003 |
| KR | 1999-0084337 | 12/1999 |
| WO | WO 02/101404 | 12/2002 |
| WO | WO 02/101404 A1 | 12/2002 |
| WO | 03/044550 | 5/2003 |

OTHER PUBLICATIONS

Yukawa, 'A Highly Sensitive Strobed Comparator', Apr. 1881, IEEE Publication, vol. SC-16, No. 2, pp. 109-113.*

Office Action issued on Feb. 22, 2008 for corresponding European Patent Application No. 04 787 748.5 and its cited references.

Office Action issued on Mar. 28, 2007 for Korean Patent Application No. 10-2006-7003814 with its full English translation.

* cited by examiner

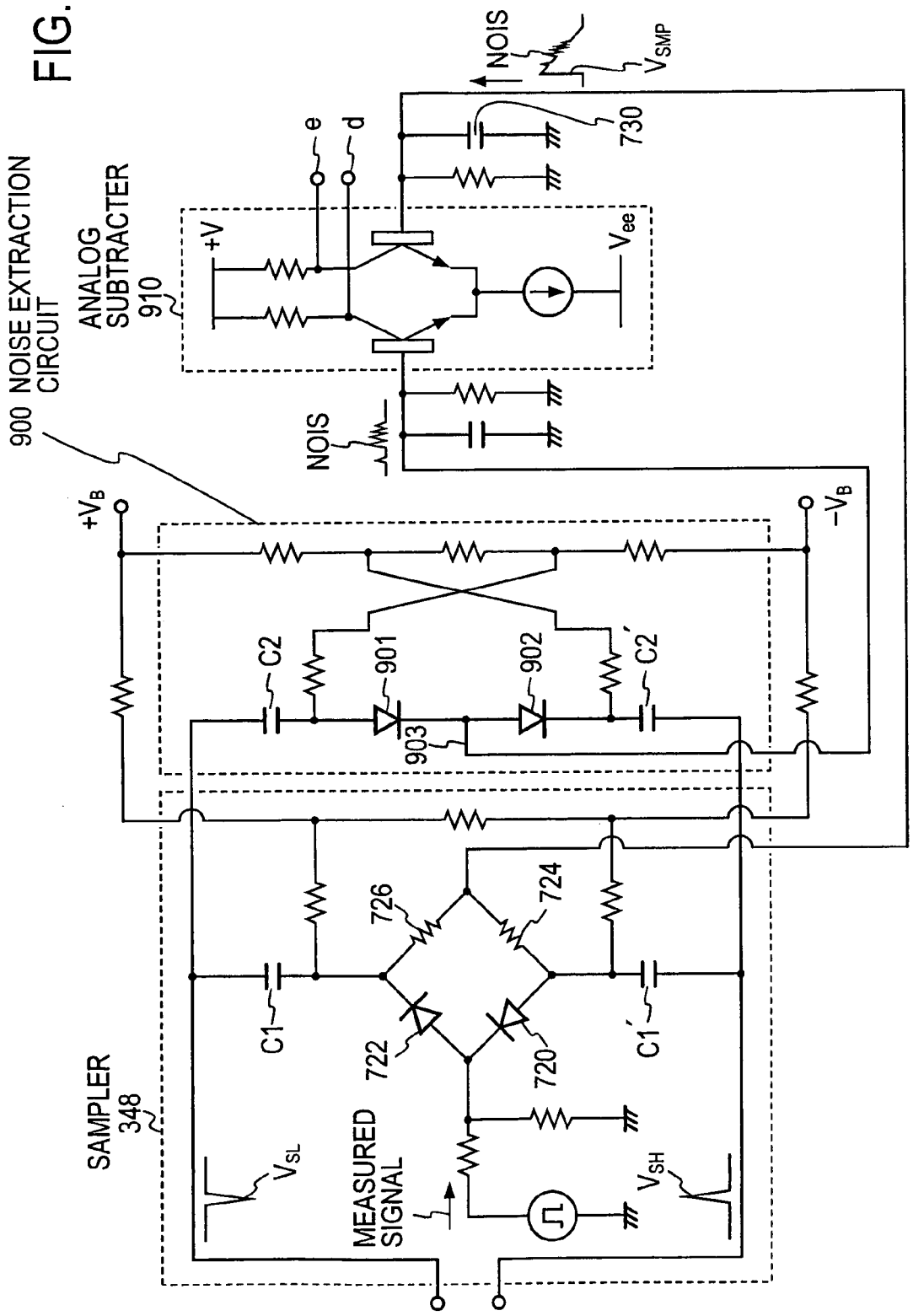

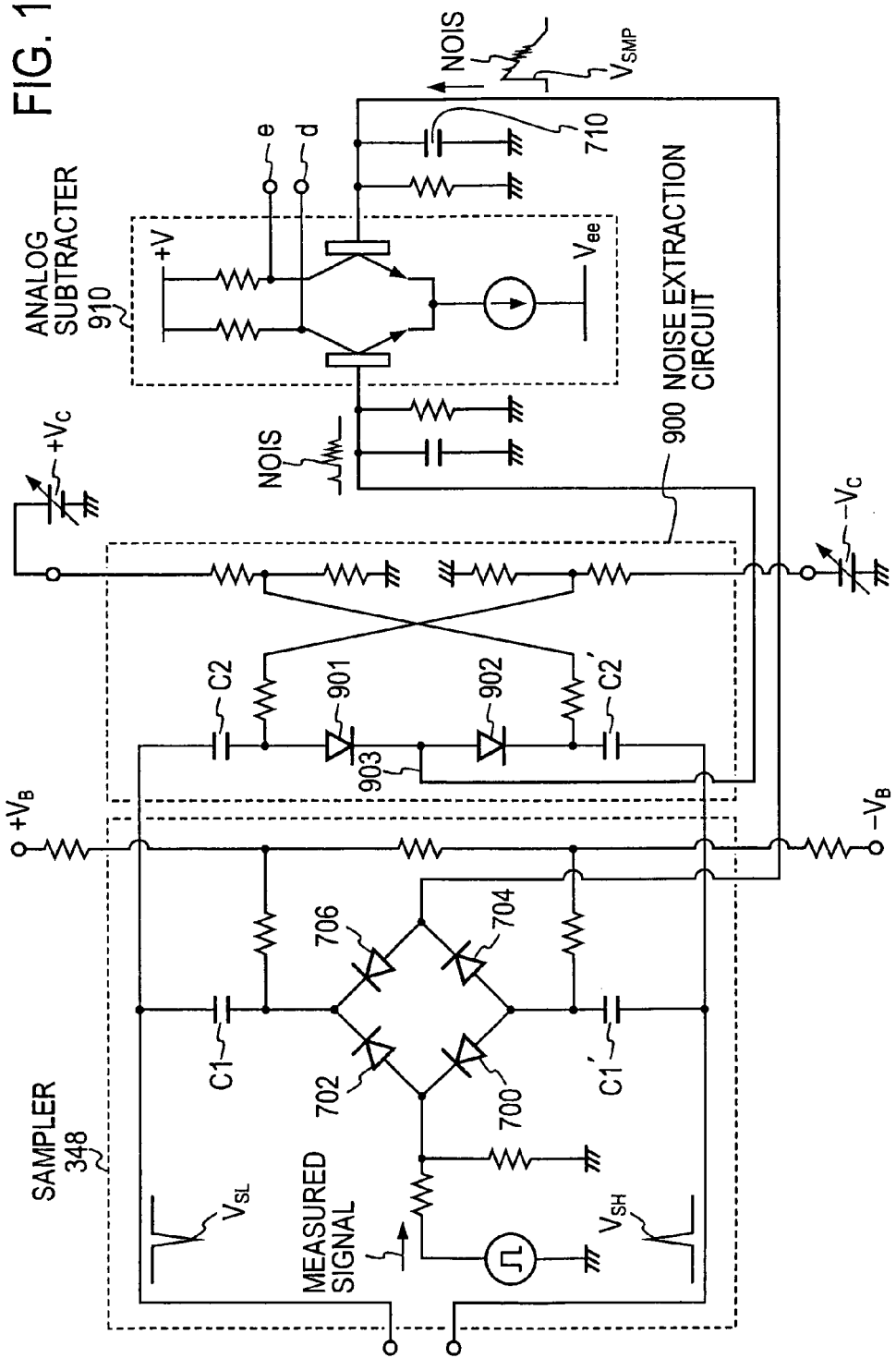

US 7,389,190 B2

TESTING APPARATUS FOR TESTING A DEVICE UNDER TEST AND COMPARATOR CIRCUIT AND CALIBRATION APPARATUS FOR THE TESTING APPARATUS

TECHNICAL FIELD

The present invention relates to a comparator circuit, a calibration apparatus, a testing apparatus, and a calibration method. The present invention particularly relates to a calibration apparatus for calibrating the output timing of a test signal applied to a device under test; a testing apparatus; a calibration method; and a comparator circuit for implementing the aforementioned devices and method.

BACKGROUND ART

A testing apparatus has conventionally been used for applying a test signal to a device under test in the case of semiconductor device testing. When the device being tested by this testing apparatus is provided with a plurality of terminals, it is sometimes necessary for the test signal to be applied to each of the plurality of terminals at a consistent timing.

FIG. 1 shows an example of the structure of the testing apparatus 10 according to the background art of the present invention. The testing apparatus 10 performs testing of the DUT (Device Under Test: device being tested) 130 by applying a test signal to each of a plurality of terminals of the DUT 130. The testing apparatus 10 is provided with a timing generator 100, a plurality of test boards 110, and a plurality of transmission channels 120. The timing generator 100 generates a timing signal indicating the timing at which the test signal is applied to the DUT 130, and feeds the timing signal to each of the plurality of test boards 110. Each of the plurality of test boards 110 is provided so as to correspond to one of the plurality of terminals of the DUT 130, and has a timing delay unit 112 for delaying the timing signal generated by the timing generator 100, and a driver 114 for applying the test signal to corresponding one of the terminals of the DUT 130 via a transmission channel 120 at the timing indicated by the timing signal thus delayed.

The plurality of drivers 114 each have varying characteristics, and since the transmission channel length is not necessarily the same in each of the plurality of transmission channels 120, there is sometimes variation in the timing at which the test signals are applied to the DUT 130 by the plurality of drivers 114. Therefore, the waveform of the test signal applied to the DUT 130 by each of the plurality of drivers 114 is observed using an oscilloscope on the point nearest to the DUT 130. The timing at which the test signal is applied to the DUT 130 by each of the plurality of drivers 114 is synchronized based on the observed waveform by calibrating the delay time caused in the timing signal by the plurality of timing delay units 112.

FIG. 2 shows the structure of a testing apparatus 20 according to the background art of the present invention. The testing apparatus 20 performs testing of the DUT by applying a test signal to each of a plurality of terminals of the DUT. The testing apparatus 20 is provided with a timing generator 200, a plurality of test boards 210, a plurality of transmission channels 215, and a calibration apparatus 220. The timing generator 200 generates a timing signal indicating the timing at which the test signal is applied to the DUT, and feeds the timing signal to each of the plurality of test boards 210. The timing generator 200 also generates a strobe signal and feeds the strobe signal to the calibration apparatus 220. Each of the plurality of test boards 210 is provided so as to correspond to one of the plurality of terminals of the DUT, and has a timing delay unit 212 for delaying the timing signal generated by the timing generator 200, and a driver 214 for applying the test signal to corresponding one of the terminals via a transmission channel 215 at the timing indicated by the timing signal thus delayed.

The calibration apparatus 220 has a comparator 222, a determination part 224, and a timing calibration part 226. The comparator 222 acquires in place of the DUT the test signal outputted by each of the plurality of drivers 214, compares the test signal thus acquired with a reference voltage $V_{REF}$, and outputs the comparison result to the determination part 224. The determination part 224 detects the comparison result outputted by the comparator 222 at the timing indicated by the strobe signal generated by the timing generator 200, and determines whether the voltage of the test signal matches the reference voltage $V_{REF}$ at that timing. The timing calibration part 226 synchronizes the timing at which the test signal is applied to the DUT by each of the plurality of drivers 214, by calibrating the test signals applied to the DUT by each of the plurality of drivers 214 by calibrating the delay time caused in the timing signal by the plurality of timing delay units 212, based on the timing at which it is determined in the determination part 224 that the voltage of the test signal matches the reference voltage $V_{REF}$.

Drawbacks are known to occur in the conventional testing apparatus for testing a DUT by applying test signals to the DUT whereby the high frequency components of the test signals are attenuated by resistance in the transmission channels and other effects, and test signals having waveforms different from desired waveforms are applied to the DUT. Techniques have been proposed for overcoming these drawbacks by using an oscilloscope to acquire waveforms of the test signals outputted by the testing apparatus and correcting the waveforms of the test signals based on the acquired waveforms (see the specification of International Patent Application Laid Open No. 03/044550, for example).

DISCLOSURE OF THE INVENTION

Problem to be Solved by the Invention

The calibration method described in FIG. 1 has drawbacks whereby efficient calibration is difficult to perform because of the need for an expensive oscilloscope and a long time for calibration. The calibration method described in FIG. 2 has drawbacks whereby the effects on equivalent rise time due to bandwidth inadequacy of the comparator 222 with the increase in frequency of the test signal, or the effects on fluctuations in the response time of the comparator 222 according to the overdrive voltage make high-precision calibration difficult to perform. The testing apparatus described in International Patent Application Laid Open No. 03/044550 also has drawbacks in that an expensive oscilloscope is required for acquiring waveforms of the test signals applied to the DUT.

Therefore, an object of the present invention is to provide a comparator circuit, a calibration apparatus, a testing apparatus, and a calibration method capable of overcoming the abovementioned drawbacks. This object is achieved by the combination of characteristics described in the independent claims. The dependent claims specify an even more useful specific example of the present invention.

Means for Solving the Above-Mentioned Problems

A first embodiment of the present invention is a comparator circuit for comparing an analog measured signal with an analog reference signal and outputting the comparison result, wherein the comparator circuit is provided with a sampler for sampling the measured signal at a predetermined timing and outputting a sample voltage of the measured signal; and a comparator for comparing the sample voltage with the reference voltage and outputting the comparison result indicating whether the sample voltage is higher than the reference voltage. The sampler may have a switching circuit and a capacitor, wherein the switching circuit applies the measured signal to the capacitor at the predetermined timing and the comparator compares the voltage applied and charged into the capacitor with the reference voltage as the sample voltage. The sampler may be provided with a noise extraction circuit for extracting noise superimposed on a sampling pulse; the noise extracted by the noise extraction circuit is subtracted from the sample voltage by an analog subtraction circuit; and the noise superimposed on the sample voltage is removed and compared with the reference voltage. The comparator may have a sample voltage transistor for amplifying the sample voltage; a reference voltage transistor for amplifying the reference voltage; and a comparison result output part for comparing the amplified sample voltage with the amplified reference voltage and outputting a comparison result indicating whether the amplified sample voltage is higher than the amplified reference voltage.

A second embodiment of the present invention is a calibration apparatus for acquiring an analog measured signal outputted by a driver and calibrating the output timing of the measured signal from the driver, wherein the calibration apparatus is provided with a sampler for sampling the measured signal at a predetermined timing and outputting a sample voltage of the measured signal; a comparator for comparing the sample voltage with an analog reference voltage and outputting a comparison result indicating whether the sample voltage is higher than the reference voltage; a determination part for determining that the sample voltage matches the reference voltage at a timing at which the comparison result changes as the timing of sampling is continuously changed by the sampler; and a timing calibration part for calibrating the output timing of the measured signal from the driver based on the timing at which it is determined in the determination part that the sample voltage matches the reference voltage.

A third embodiment of the present invention is a testing apparatus for testing a device under test; wherein the testing apparatus is provided with a timing generator for generating a timing signal indicating the timing at which a test signal is applied to each of a plurality of terminals provided to the device under test; a plurality of timing delay units for delaying each timing signal; a plurality of drivers provided so as to correspond with each of the plurality of timing delay units, for applying the test signal to each of the plurality of terminals at the timing indicated by each of the timing signals delayed by each of the plurality of timing delay units; a sampler for sampling the test signal outputted by the corresponding driver for each of the plurality of drivers at a predetermined timing, and outputting a sample voltage of the test signal; a comparator for comparing the sample voltage with an analog reference voltage and outputting a comparison result indicating whether the sample voltage is higher than the reference voltage; a determination part for determining that the sample voltage matches the reference voltage at a timing at which the comparison result changes as the timing of sampling is continuously varied by the sampler; and a timing calibration part for calibrating the delay time caused in the timing signal by at least one of the plurality of timing delay units based on the timing at which it is determined in the determination part that the sample voltage matches the reference voltage for each of the plurality of drivers in order to synchronize the timing at which the test signal outputted by each of the plurality of drivers is applied to the device under test.

The timing generator may also generate a strobe signal in relation to the timing signal, for indicating the timing at which the sampler samples, and the timing at which the determination part detects the comparison results. The testing apparatus may also be provided with a frequency divider for frequency-dividing the strobe signal; and a strobe delay unit for delaying the strobe signal frequency-divided in the frequency divider; wherein the determination part determines that the sample voltage matches the reference voltage in the delay time by which the comparison result is changed when the delay time by which the strobe delay unit delays the strobe signal is changed; and the timing calibration part calibrates the delay time caused in the timing signal by at least one of the plurality of timing delay units based on the delay time of the strobe signal at which it is determined in the determination part that the sample voltage matches the reference voltage for each of the plurality of drivers in order to synchronize the timing at which the test signal outputted by each of the plurality of drivers is applied to the device under test.

The testing apparatus may be provided with a reference voltage controller for continuously changing the reference voltage with which the comparator compares the sample voltage of the test signal, in order to acquire a voltage at the timing indicated by the delayed strobe signal in the test signal outputted by each of the plurality of drivers; and a waveform acquisition part for acquiring the waveform of the test signal outputted by each of the plurality of drivers, by continuously changing the delay time for delaying the strobe signal by the strobe delay unit, and by continuously changing the reference voltage by the reference voltage controller. The testing apparatus may also be provided with a test signal correction part for correcting the signal outputted by the driver so that the desired the test signal is applied to the device under test based on the waveform of the test signal outputted by each of the plurality of drivers acquired by the waveform acquisition part.

A fourth embodiment of the present invention is a calibration method for acquiring the test signal outputted by each of a plurality of drivers provided in a testing apparatus for testing a device under test and calibrating the output timing of the test signal from each of the plurality of drivers; wherein the calibration method includes a timing generation step for generating a timing signal indicating the timing at which the test signal is applied to each of a plurality of terminals of the device under test; a timing delay step for delaying each timing signal and outputting a plurality of delayed timing signals; a test signal outputting step whereby the plurality of drivers each output the test signal at the timing indicated by each of the plurality of delayed timing signals; a sampling step for sampling at a predetermined timing the analog test signal outputted by the driver and outputting the sample voltage of the test signal for each of the plurality of drivers; a comparison step for comparing the sample voltage with an analog reference voltage and outputting comparison results indicating whether the sample voltage is higher than the reference voltage; a determination step for determining that the sample voltage matches the reference voltage when the comparison result changes as the timing at which the test signal is sampled in the sampling step is continuously varied; and a timing calibration step for calibrating the delay time caused in the timing signal by at least one of the plurality of timing delay units provided so as to correspond to each of the plurality of drivers, based on the timing at which it is determined in the determination step that the sample voltage matches the reference voltage for each of the plurality of drivers in order to synchronize the timing at which the test signal outputted by each of the plurality of drivers is applied to the device under test.

A fifth embodiment of the present invention is a testing apparatus for testing a device under test; wherein the testing apparatus is provided with a driver for applying a test signal to the device under test; a sampler for sampling at a predetermined timing the analog output signal outputted from the device under test and outputting a sample voltage of the output signal in relation to the test signal applied by the driver to the device under test; and a comparator for comparing the sample voltage with an analog reference voltage and outputting a comparison result indicating whether the sample voltage is higher than the reference voltage.

The summary of the present invention given above does not enumerate all of the necessary characteristics of the present invention, and sub-combinations of these characteristics are also encompassed by the present invention.

Effect of The Invention

By the present invention, calibration of the timing at which a test signal is applied to a device under test can be performed with high precision without the use of an expensive oscilloscope.

BRIEF DESCRIPTION OF THE DRAWINGS

FIG. 12 is a connection diagram for describing another working example of the sampler having noise removal capability shown in FIG. 10;

FIG. 13 is a connection diagram for describing another working example of the sampler having noise removal capability shown in FIG. 10;

BEST MODE FOR CARRYING OUT THE INVENTION

Embodiments of the present invention will be described hereinafter, but the embodiments described below in no way limit the present invention as defined in the claims, and not necessarily all combinations of characteristics described in these embodiments are essential for achieving the objects of the present invention.

Figure 1:
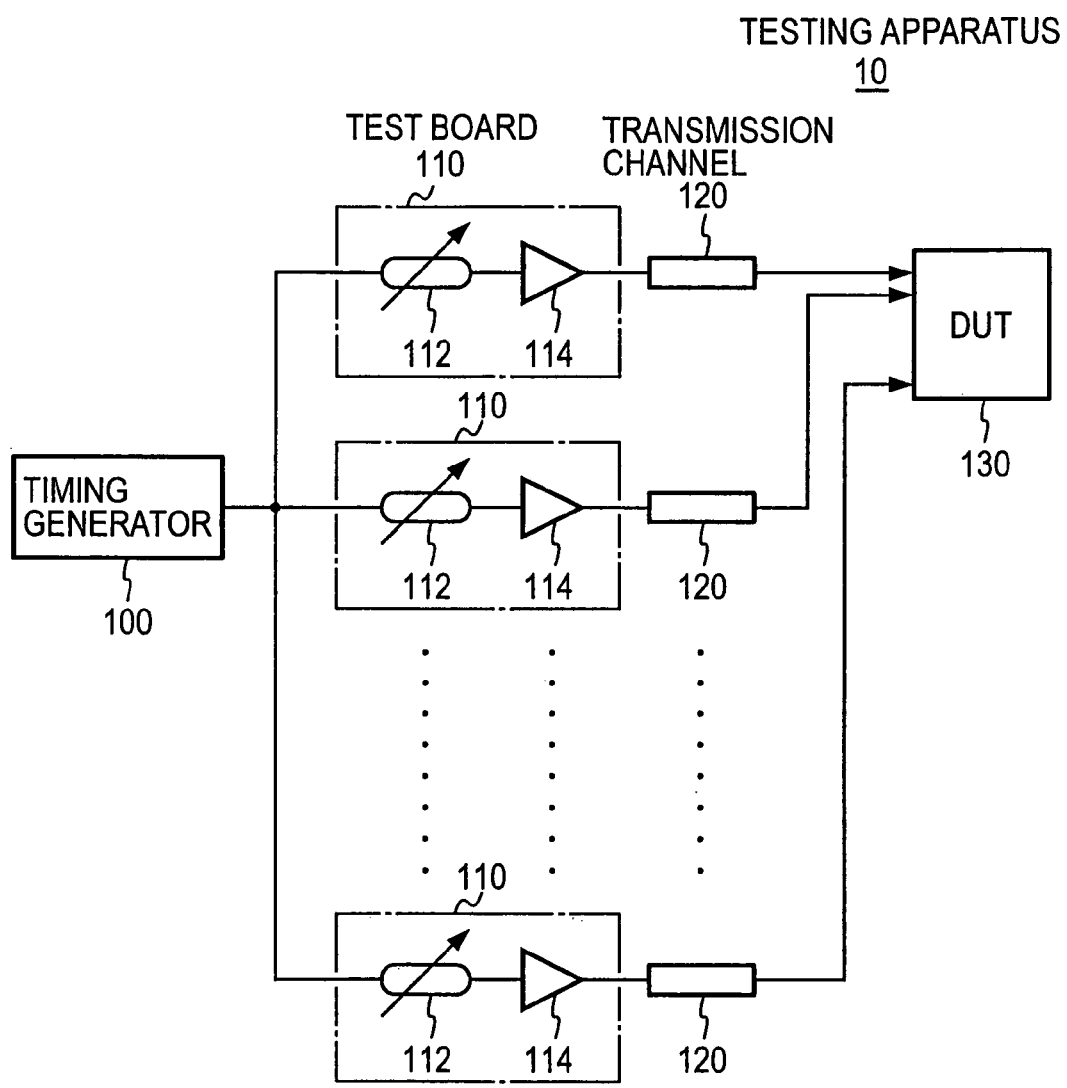
FIG. 1 is a block diagram showing an example of the structure of the testing apparatus 10 according to the background art of the present invention.
Figure 2:
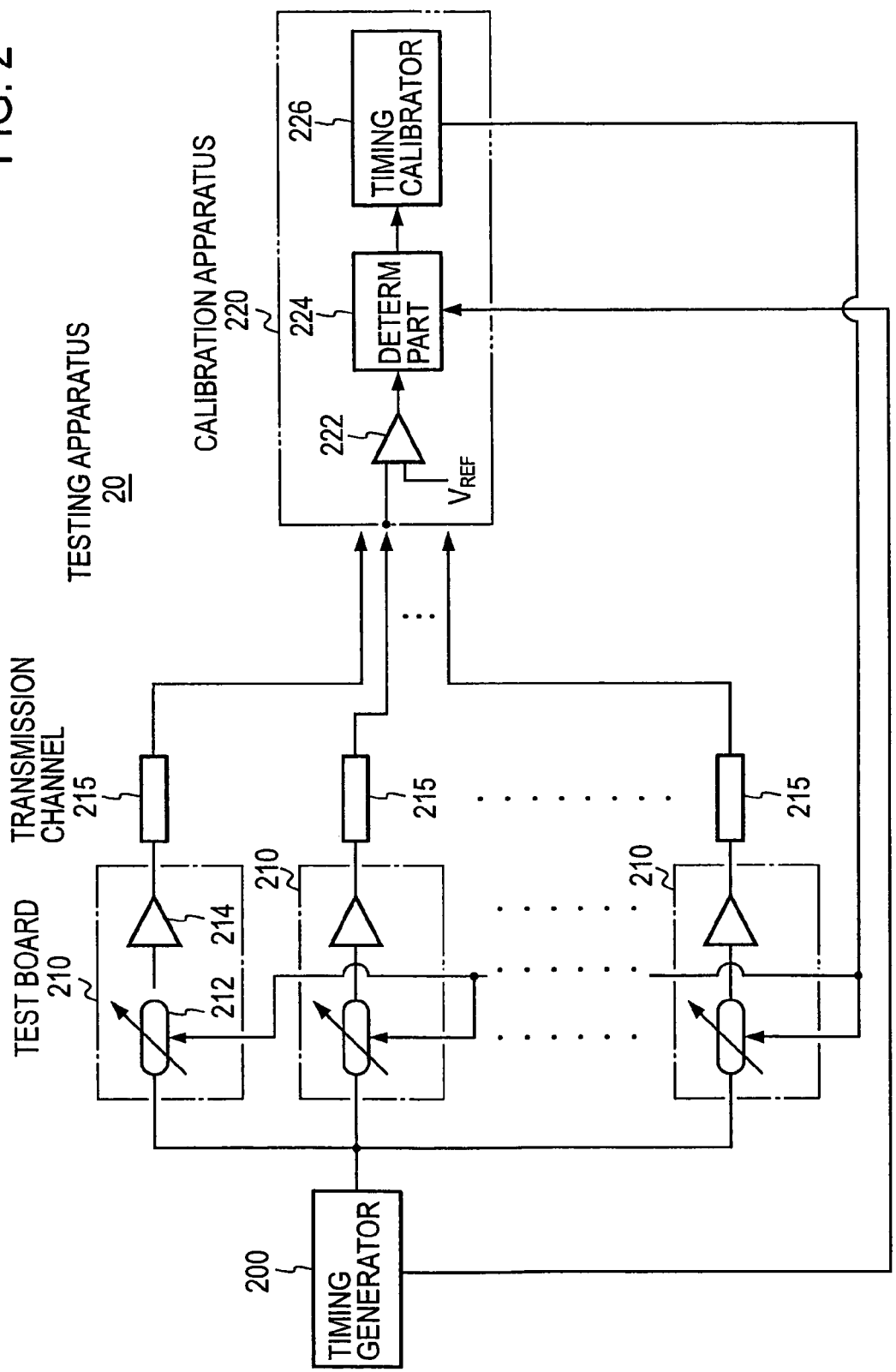
FIG. 2 is a block diagram showing an example of the structure of the testing apparatus 20 according to the background art of the present invention.
Figure 3:
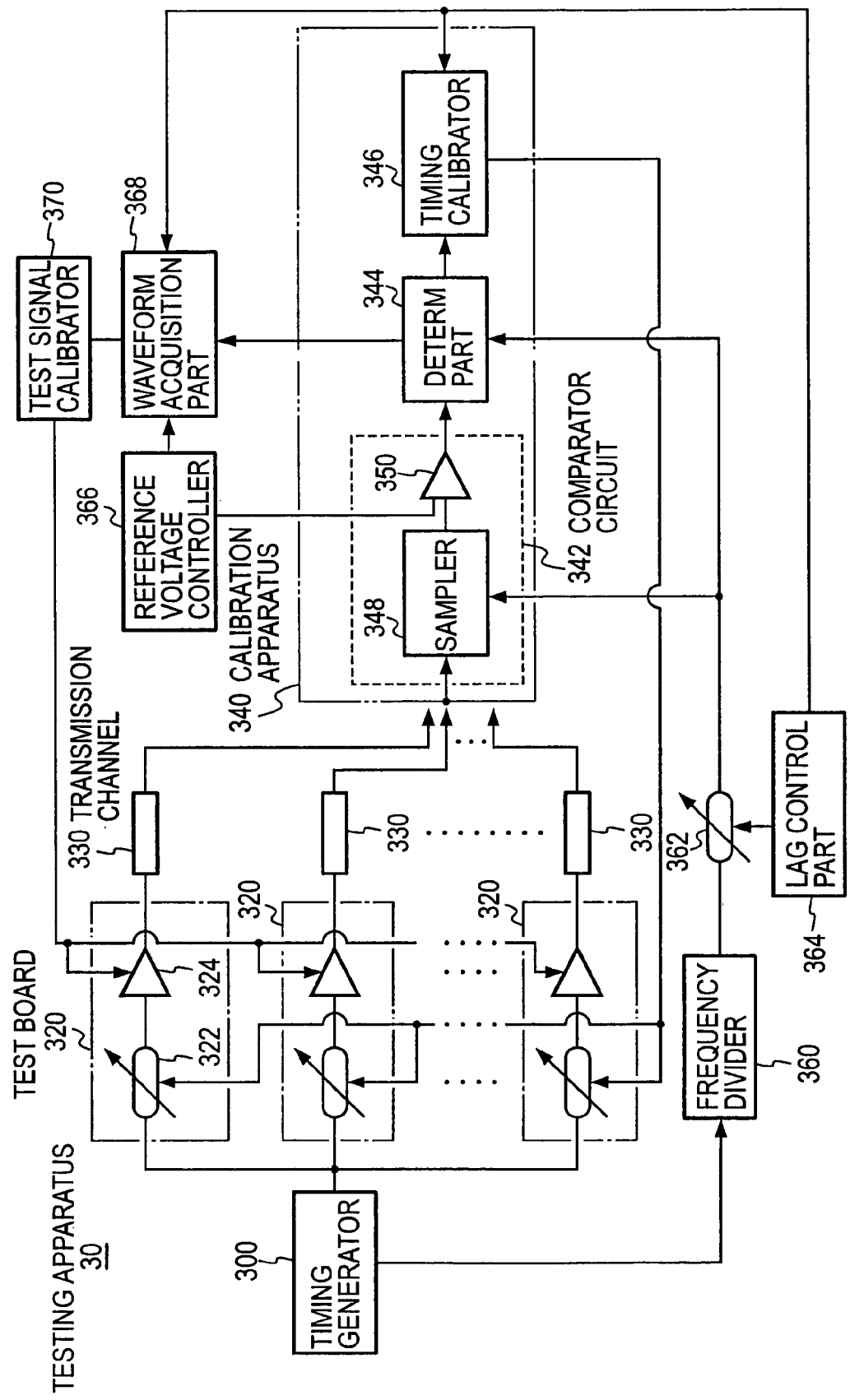
FIG. 3 is a block diagram showing an example of the overall structure of the testing apparatus 30 according to a first embodiment of the present invention.

FIG. 3 shows an example of the overall structure of the testing apparatus 30 according to a first embodiment of the present invention. The testing apparatus 30 generates a test signal and applies the test signal to the DUT, compares with an expected value the output signal outputted as a result of the operation of the DUT based on the test signal, and determines the quality of the DUT. In the testing apparatus 30 according to the present embodiment, the calibration apparatus 340 acquires in place of the DUT the test signals generated and outputted by a plurality of test boards 320. The calibration apparatus 340 performs calibration for the output timing of the test signal in each of the plurality of test boards 320 for applying the test signal to each of a plurality of terminals of the DUT, based on the results of sampling the acquired test signal and comparing the test signal with a reference voltage. The purpose of this configuration is for the plurality test boards 320 to synchronize the timing at which the test signal is applied to each of the plurality of terminals, and to perform high-precision testing of the DUT.

The testing apparatus 30 is provided with a timing generator 300, a plurality of test boards 320, a plurality of transmission channels 330, a frequency divider 360, a strobe delay unit 362, a delay controller 364, a calibration apparatus 340, a reference voltage controller 366, a waveform acquisition part 368, and a test signal correction part 370. The timing generator 300 generates a timing signal indicating the timing at which the test signal is applied to each of the plurality of terminals of the DUT, and feeds the timing signal to each of the plurality of test boards 320. The timing generator 300 also generates and feeds to the calibration apparatus 340 a strobe signal in relation to the timing signal, for indicating the timing at which the test signal is sampled in the calibration apparatus 340, and the timing at which the result of comparison with the reference voltage is detected.

Each of the plurality of test boards 320 is provided so as to correspond to one of the plurality of terminals of the DUT, and has a timing delay unit 322 and a driver 324. The timing delay unit 322 delays the timing signal generated by the timing generator 300, and outputs the delayed timing signal to the driver 324. The driver 324 applies the test signal via a transmission channel 330 to the terminal corresponding to the test board 320 having the driver 324 at the timing indicated by the timing signal delayed by the timing delay unit 322.

The frequency divider 360 frequency-divides the strobe signal outputted by the timing generator 300, and outputs the frequency-divided signal to the strobe delay unit 362. The strobe delay unit 362 delays the strobe signal frequency-divided in the frequency divider 360, and outputs the result to the calibration apparatus 340. The delay controller 364 sets the delay time of the strobe signal in the strobe delay unit 362, and notifies the calibration apparatus 340 and the waveform acquisition part 368 of the delay time thus set.

The calibration apparatus 340 acquires in place of the DUT the analog test signal outputted by each of the plurality of drivers 324, and calibrates the output timing of the test signals from each of the plurality of drivers 324 based on the test signal thus acquired. The calibration apparatus 340 has a comparator circuit 342, a determination part 344, and a timing calibration part 346. The comparator circuit 342 includes a sampler 348 and a comparator 350, compares the analog test signal (measured signal) outputted by each of the plurality of drivers 324 with an analog reference voltage, and outputs the comparison result.

The sampler 348 samples the analog test signal outputted by the driver 324 for each of the plurality of drivers 324 at a predetermined timing, and outputs the sample voltage of the test signal to the comparator 350. Specifically, the sampler 348 samples the test signal at the timing indicated by the strobe signal that is frequency-divided in the frequency divider 360 and delayed in the strobe delay unit 362. The comparator 350 compares the analog sample voltage outputted by the sampler 348 with an analog reference voltage, and outputs to the determination part 344 the comparison result indicating whether the sample voltage is higher than the reference voltage. Specifically, the comparator 350 outputs the logical value "1" as the comparison result to the determination part 344 when the analog sample voltage is higher than the analog reference voltage, and outputs the logical value "0" when the analog sample voltage is lower than the analog reference voltage.

The determination part 344 detects the comparison result outputted by the comparator 350 at a timing based on the timing at which the sampler 348 samples the test signal. The determination part 344 determines that the sample voltage matches the reference voltage at a timing when the detected comparison result changes as the timing at which the sampler 348 samples the test signal is continuously varied, and outputs the determination result to the timing calibration part 346 and the waveform acquisition part 368. Specifically, the determination part 344 detects the comparison result at a timing based on the delayed strobe signal, and determines that the sample voltage matches the reference voltage at a delay time where the comparison result changes as the delay controller 364 continuously varies the delay time of the strobe signal set in the strobe delay unit 362.

The timing calibration part 346 calibrates the delay time caused in the timing signal by at least one of the plurality of timing delay units 322 based on the timing at which it is determined in the determination part 344 that the sample voltage matches the reference voltage for each of the plurality of drivers 324 in order to synchronize the timing at which the test signal outputted by each of the plurality of drivers 324 is applied to the DUT. Specifically, the timing calibration part 346 calibrates the delay time caused in the timing signal by at least one of the plurality of timing delay units 322 based on the delay time of the strobe signal acknowledged by the delay controller 364 when it is determined in the determination part 344 that the sample voltage matches the reference voltage for each of the plurality of drivers 324.

The reference voltage controller 366 continuously changes the reference voltage with which the comparator 350 compares the sample voltage of the test signal, in order to acquire a voltage at the timing indicated by the delayed strobe signal in the test signal outputted by each of the plurality of drivers 324. The waveform acquisition part 368 plots the waveform of the test signal outputted by each of the plurality of drivers 324 and acquires data for a plurality of plotted points, by the delay controller 364 continuously changing the delay time by which the strobe signal is delayed by the strobe delay unit 362, and the reference voltage controller 366 continuously changing the reference voltage, and outputs the point data to the test signal correction part 370.

Figure 4:
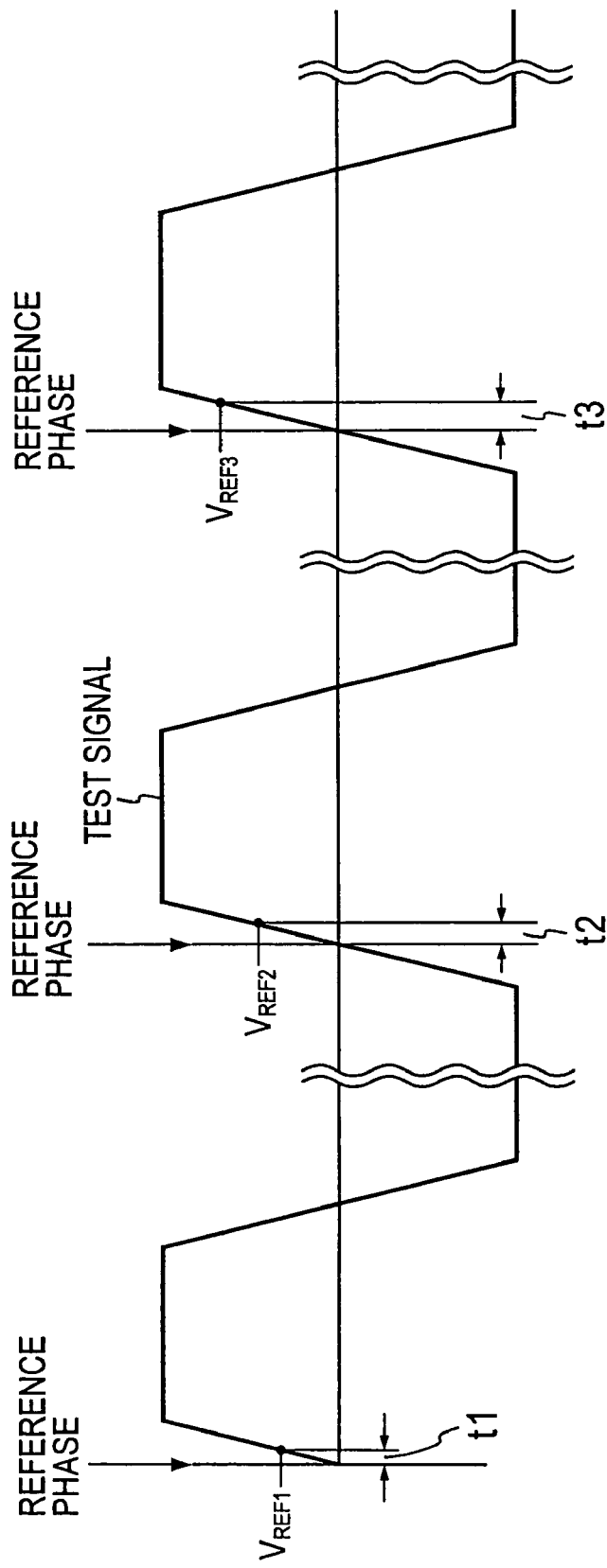
FIG. 4 is a waveform diagram for describing the operation of the waveform acquisition part 368 shown in FIG. 3.

FIG. 4 shows the manner in which the point data for plotting the waveform of the test signal are acquired. In this arrangement, the substantial midpoint of the rise time of the test signal is set as the reference phase, the test signal is sampled while the delay time is offset in the sequence t1, t2, t3, . . . from this reference phase, the sampled voltage is found in relation to the reference voltage $V_{REF}$, the voltage of the test signal at each delay time t1, t2, t3, . . . is plotted, and at least one period of the test signal is recorded. The waveform acquisition part 368 can draw the waveform of the test signal based on the data thus acquired for indicating the points on the waveforms of the plurality of test signals.

By adjusting resistance in the transmission channels 330, for example, the test signal correction part 370 corrects the signal outputted by each of the plurality of drivers 324 on the basis of the waveform of the test signal outputted by each of the plurality of drivers 324 and acquired by the waveform acquisition part 368. The test signal correction part 370 may, for example, correct the waveform of the test signal inputted to the drivers 324 from a waveform shaper or other circuit provided in each test board 320. Alternatively, the test signal correction part 370 may correct the waveform of the test signal outputted by each driver 324. In yet another alternative, the test signal correction part 370 may correct the waveform of the test signal inside each driver 324.

By the testing apparatus 30 according to the present embodiment, the calibration apparatus 340 can calibrate the timing of the plurality of timing delay units 322 based on the timing at which the test signal is applied to the DUT by each of the plurality of drivers 324. The testing apparatus 30 can thereby test the DUT without the use of an expensive oscilloscope.

By the testing apparatus 30 according to the present embodiment, the waveform acquisition part 368 can precisely acquire the waveform of the test signal outputted by each of the plurality of drivers 324. The test signal correction part 370 can also correct the waveform of the test signal outputted by each of the plurality of drivers 324 based on the waveform of the test signal thus acquired. The testing apparatus 30 can thereby apply a test signal having a more correct waveform to the DUT and test the DUT with high precision.

Figure 5:
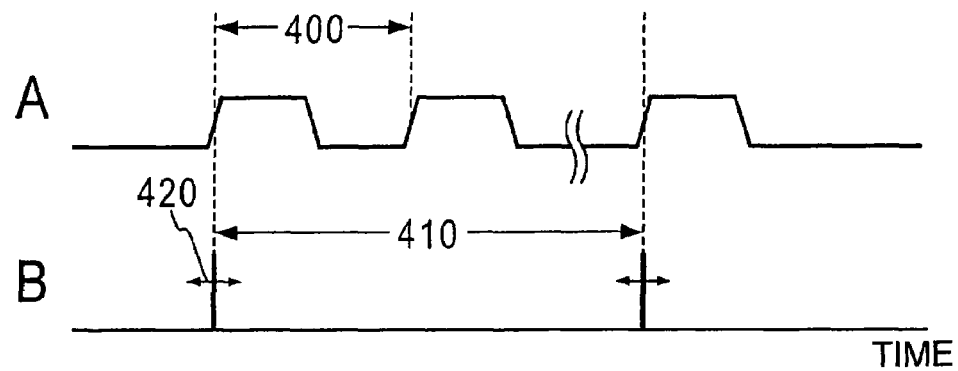
FIG. 5 is a waveform diagram showing an example of the relationship between the test signal and the strobe signal.

FIG. 5 shows an example of the relationship between the test signal and the strobe signal. FIG. 5A shows an example of the waveform of the test signal (signal to be measured) inputted to the sampler 348. The timing generator 300 generates a strobe signal in relation to the timing signal indicating the timing at which the driver 324 applies the test signal to the DUT. For example, the timing generator 300 may generate a strobe signal that has a pulse at the substantial midpoint of the rise time of the test signal outputted based on the timing signal, so that the period of the pulse becomes the same as the period 400 in the test signal.

FIG. 5B shows an example of the waveform of the frequency-divided strobe signal. The frequency divider 360 frequency-divides the period of the pulses of the strobe signal generated by the timing generator 300 so that the period may become an integer multiple of the period 400 of the test signal, for example, the period 410, and outputs the result to the strobe delay unit 362. The strobe delay unit 362 delays the strobe signal frequency-divided by the frequency divider 360 based on the delay time set by the delay controller 364. The strobe delay unit 362 may use either a positive or negative delay time, as indicated by the delay time 420, for example.

Figure 6:
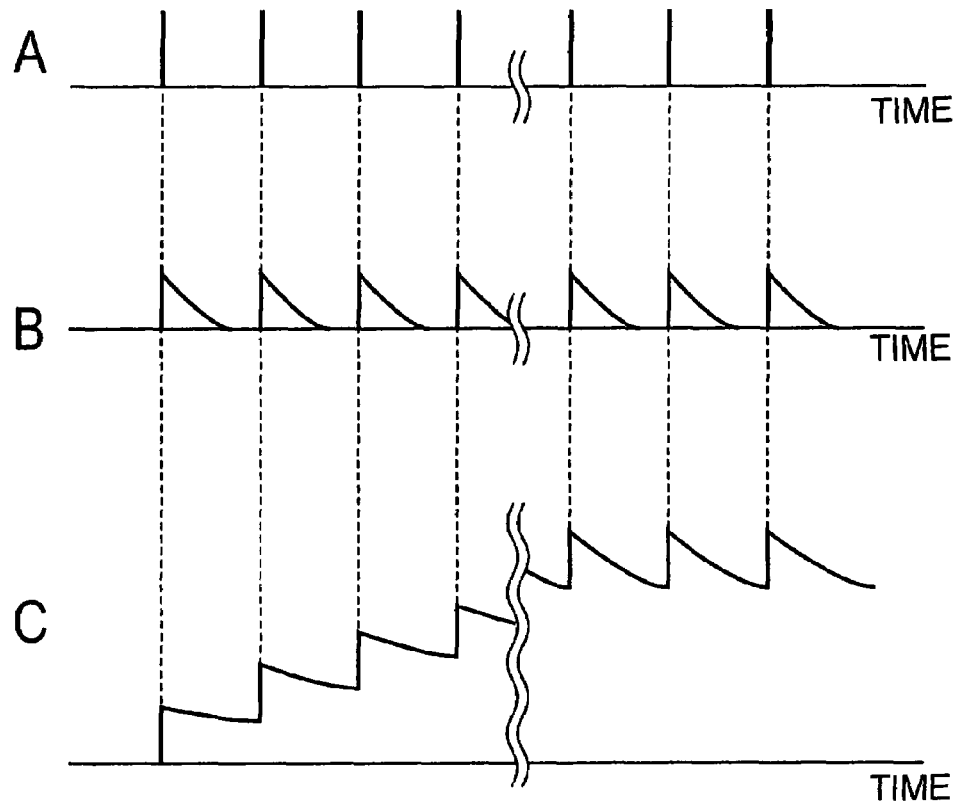
FIG. 6 is waveform diagram showing an example of the relationship between the strobe signal and the sample voltage.

FIG. 6 shows an example of the relationship between the strobe signal and the sample voltage. FIG. 6A shows an example of the strobe signal. FIGS. 6B and 6C show examples of the sample voltages of the strobe signal shown in FIG. 6A. The sampler 348 applies the sample voltage to a capacitor, whereby the capacitor is charged with the sample voltage, and discharges the entire charged amount over a period of time indicated by the discharge time determined by the discharge time constant in the sampler 348. When the discharge time is shorter than the period of the strobe signal, the sampler 348 discharges the entire sample voltage charged in one sampling by the time the next sampling is executed. Consequently, when the sample voltage must be evaluated for each sampling, as with jitter measurement in the test signal, for example, the sampler 348 can output the appropriate sample voltage by setting the frequency dividing number in the frequency divider 360 so that the period of the strobe signal becomes longer than the discharge time.

When the discharge time is longer than the period of the strobe signal, the sampler 348 amplifies the sample voltage by repeating sampling on a portion of the sample voltage even remained in the next sampling. The amplified sample voltage reaches equilibrium in a voltage value determined by the charge time constant and discharge time constant in the sampler 348. The sampler 348 generally outputs a sample voltage that is low with respect to the voltage of the inputted test signal in a single sampling. Specifically, the sampler 348 outputs a sample voltage that is $1/10^{th}$ to $1/100^{th}$ the voltage of the inputted test signal in a single sampling. Consequently, the sampler 348 can output a sample voltage that is detectable by the comparator 350 by setting the frequency division number in the frequency divider 360 so that the period of the strobe signal is shorter than the discharge time, and amplifying the sample voltage when the sample voltage outputted in a single sampling is low with respect to the voltage that can be detected by the comparator 350.

Figure 7:
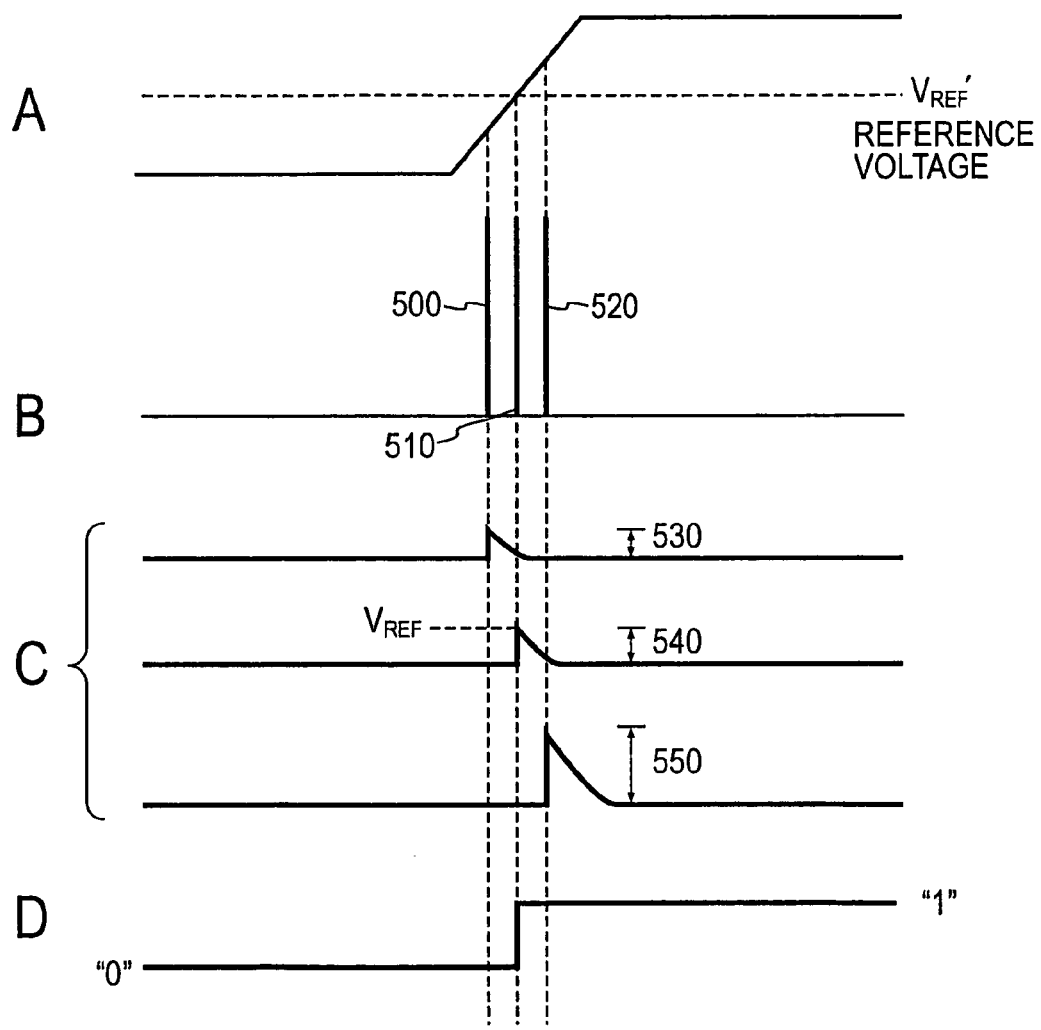
FIG. 7 is a waveform diagram showing an example of the relationship between the sample voltage and the comparison results in the comparator 350.

FIG. 7 shows an example of the relationship between the sample voltage and the comparison result of the comparator 350. FIG. 7A shows an example of the waveform of the test signal inputted to the sampler 348. The sampler 348 outputs the sample voltage as the reference voltage $V_{REF}$ when the reference voltage $V_{REF}'$ in application to the DUT is sampled as the test signal.

FIG. 7B shows an example of the waveform that is the composite of the waveforms of strobe signals generated at different timings. FIG. 7C shows an example of the sample voltage that corresponds to each of the different strobe signals. The sampler 348 outputs a sample voltage 530 that is below the reference voltage $V_{REF}$ when the test signal is sampled at the timing indicated by the strobe signal 500. When the test signal is sampled at the timing indicated by the strobe signal 510, the sampler 348 outputs a sample voltage 540 that matches the reference voltage $V_{REF}$. The sampler 348 outputs a sample voltage 550 that is above the reference voltage $V_{REF}$ when the test signal is sampled at the timing indicated by the strobe signal 520.

FIG. 7D shows an example of the change in the comparison result in the comparator 350 detected by the determination part 344 when the delay time in the strobe signal is changed. The determination part 344 outputs the comparison result as the logical value "0" in the timing based on the strobe signal (strobe signal 500, for example) outputted by a sample voltage that is lower than the sample voltage 540. The determination part 344 outputs the comparison result as the logical value "1" in the timing based on the strobe signal (strobe signal 520, for example) outputted by a sample voltage that is higher than the sample voltage 540. In other words, the comparison result detected by the determination part 344 varies near the delay time in the strobe signal 510 corresponding to the sample voltage 540 that matches the reference voltage $V_{REF}$. Therefore, when the delay controller 364 continuously varies the delay time of the strobe signal, the determination part 344 determines that the voltage of the test signal inputted to the sampler 348 matches the reference voltage $V_{REF}'$ in application to the DUT in the delay time in which the comparison result in the comparator 350, detected at the timing indicated by the delayed strobe signal, changes.

The timing calibration part 346 calibrates the delay time caused in the timing signal in the timing delay unit 322 corresponding to the driver 324 that outputted the test signal, based on the timing at which it is detected in the determination part 344 that the voltage of the test signal matches the reference voltage $V_{REF}'$, and synchronizes the timing at which the voltage of the test signal applied to the DUT by each of the plurality of drivers 324 reaches the reference voltage $V_{REF}'$. The timing calibration part 346 selects a single driver 324 from among the plurality of drivers 324, and calibrates the delay time of the timing delay unit 322 corresponding to each of the plurality of other drivers 324 so as to synchronize the timing of application of the test signal by each of the plurality of other drivers 324 with the timing of test signal application in the selected driver 324. In an alternate configuration, the timing calibration part 346 calibrates the delay time of the timing delay unit 322 corresponding to each of the plurality of drivers 324 so as to synchronize the timing of application of the test signal in each of the plurality of drivers 324 with a predetermined timing.

By the testing apparatus 30 according to the present embodiment, the timing at which the voltage of the test signal matches the reference voltage can be reliably detected by detecting the change in the result of comparison between the sample voltage and the reference voltage while the delay time of the strobe signal is continuously varied. The calibration apparatus 340 can thereby calibrate the timing at which the test signal is applied to the DUT with higher precision.

Figure 8:
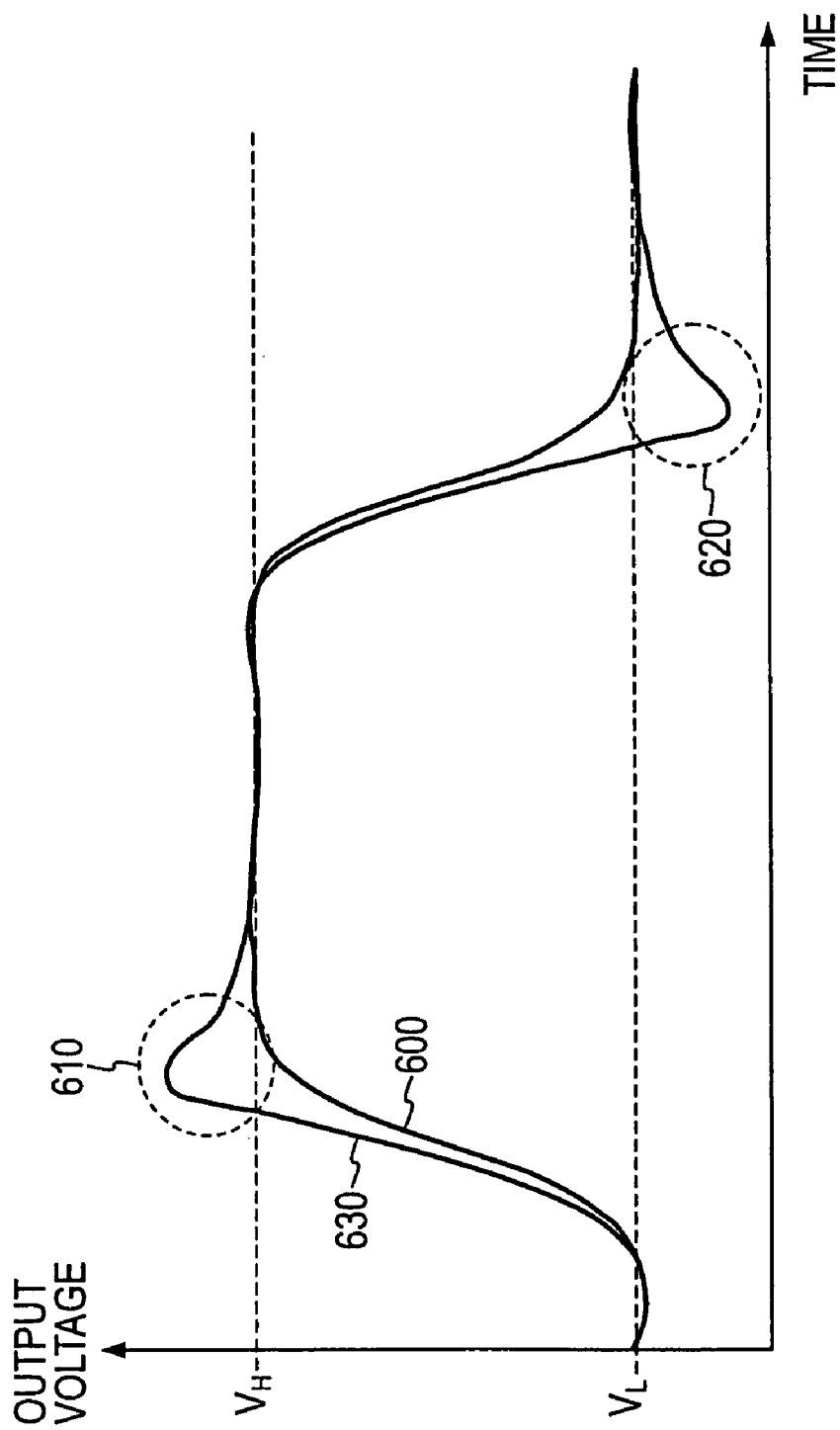
FIG. 8 is a waveform diagram showing an example of the relationship between the desired waveform 600 of the test signal and the waveform 630 of the test signal corrected by the test signal correction part 370.

FIG. 8 shows an example of the relationship between the desired waveform 600 of the test signal and the waveform 630 of the test signal corrected by the test signal correction part 370. The waveform 600 is the desired waveform of the test signal applied to the DUT. Even when the waveform of the test signal outputted by the driver 324 is the same as the waveform 600 immediately after being outputted, the high frequency components thereof can be attenuated by resistance in the transmission channels 330 and other effects, for example, and the waveform can be different from the waveform 600 immediately before being applied to the DUT. The test signal correction part 370 corrects the test signal outputted by the driver 324 so that the waveform of the test signal applied to the DUT is the desired waveform 600, based on the waveform of the test signal acquired by the waveform acquisition part 368. For example, the test signal correction part 370 corrects the waveform so that the rising portion 610 is higher than the high-side voltage $V_H$, and the falling portion 620 is lower than the low-side voltage $V_L$.

By the testing apparatus 30 according to the present embodiment, the test signal correction part 370 can make the waveform of the test signal applied to the DUT into the desired waveform by correcting the waveform of the test signal outputted by the driver 324. The testing apparatus 30 can thereby apply a test signal to the DUT that has the correct rising portion or falling portion, and can execute high-precision testing.

Figure 9A:
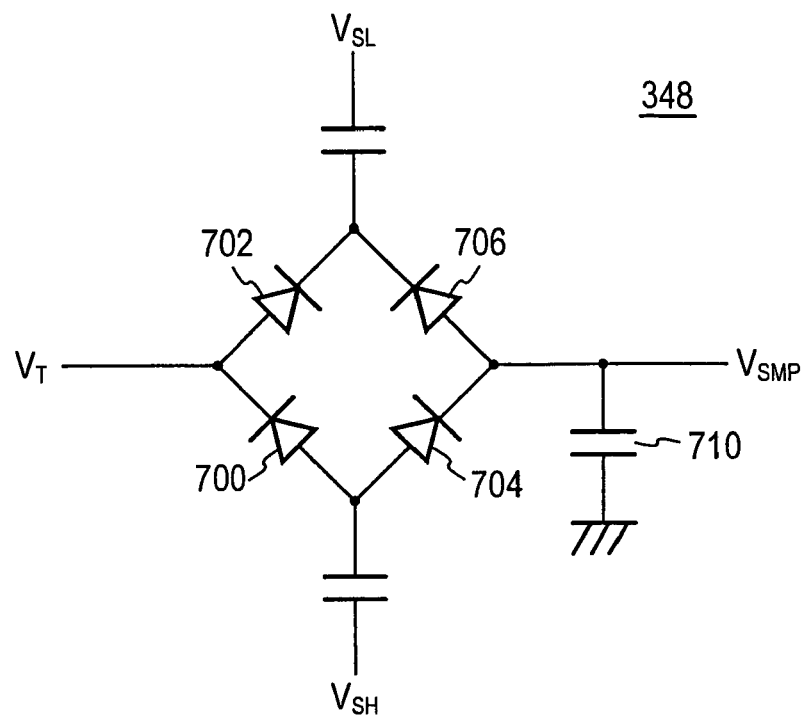
FIG. 9 is a connection diagram showing an example of the structure of the sampler 348.

FIG. 9 shows an example of the structure of the sampler 348. FIG. 9A shows an example of the structure of the sampler 348 in which four diodes are used. The sampler 348 includes a switching circuit having diodes 700, 702, 704, and 706, and a capacitor 710. The diodes 700, 702, 704, and 706 are turned on by inputting a strobe signal $V_{SH}$ and a strobe signal $V_{SL}$, which is reverse in positive and negative to the strobe signal $V_{SH}$, to the sampler 348. In this case, since there is no difference in electrical potential between the midpoint of the diode 700 and the diode 702, and the midpoint of the diode 704 and the diode 706, the electrical potential generated at the midpoint between diode 700 and diode 702 by the inputting of the test signal $V_T$ is also generated in the midpoint between diode 704 and diode 706, and is applied to the capacitor 710. Thus, the switching circuit composed of a bridge circuit that uses four diodes applies the test signal $V_T$ to the capacitor 710 at a predetermined timing, that is, at the timing indicated by the strobe signal. The comparator 350 compares the voltage applied to and charged into the capacitor 710 as the sample voltage $V_{SMP}$ with the reference voltage.

Figure 9B:
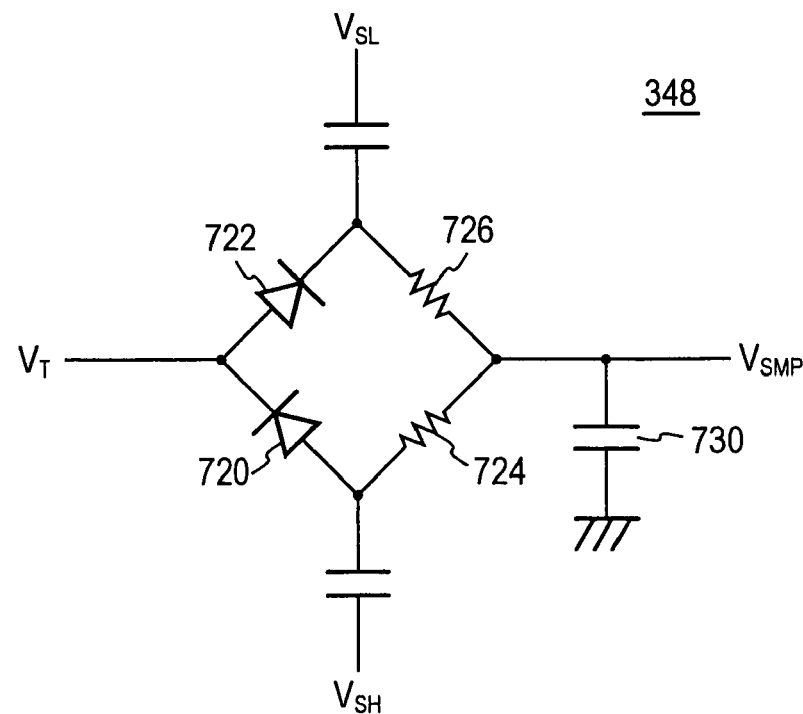

FIG. 9B shows an example of the structure of a sampler 348 that uses two diodes. The sampler 348 is composed of a switching circuit that includes a diode 720 and a diode 722, a resistor 724, a resistor 726, and a capacitor 730. The sampler 348 turns diode 720 and diode 722 on in response to the inputting of a strobe signal $V_{SH}$ and a strobe signal $V_{SL}$ which is reverse in positive and negative to the strobe signal $V_{SH}$. In this case, since there is no difference in electrical potential between the midpoint of diode 720 and diode 722 and the midpoint of resistor 724 and resistor 726, the potential generated in the midpoint between diode 720 and diode 722 by the inputting of the test signal $V_T$ is also generated in the midpoint between resistor 724 and resistor 726, and is applied to the capacitor 730. Thus, the switching circuit that uses two diodes applies the test signal $V_T$ to the capacitor 730 at a predetermined timing, that is, at the timing indicated by the strobe signal. The comparator 350 compares the voltage applied to and charged into the capacitor 730 as the sample voltage $V_{SMP}$ with the reference voltage.

Figure 10:
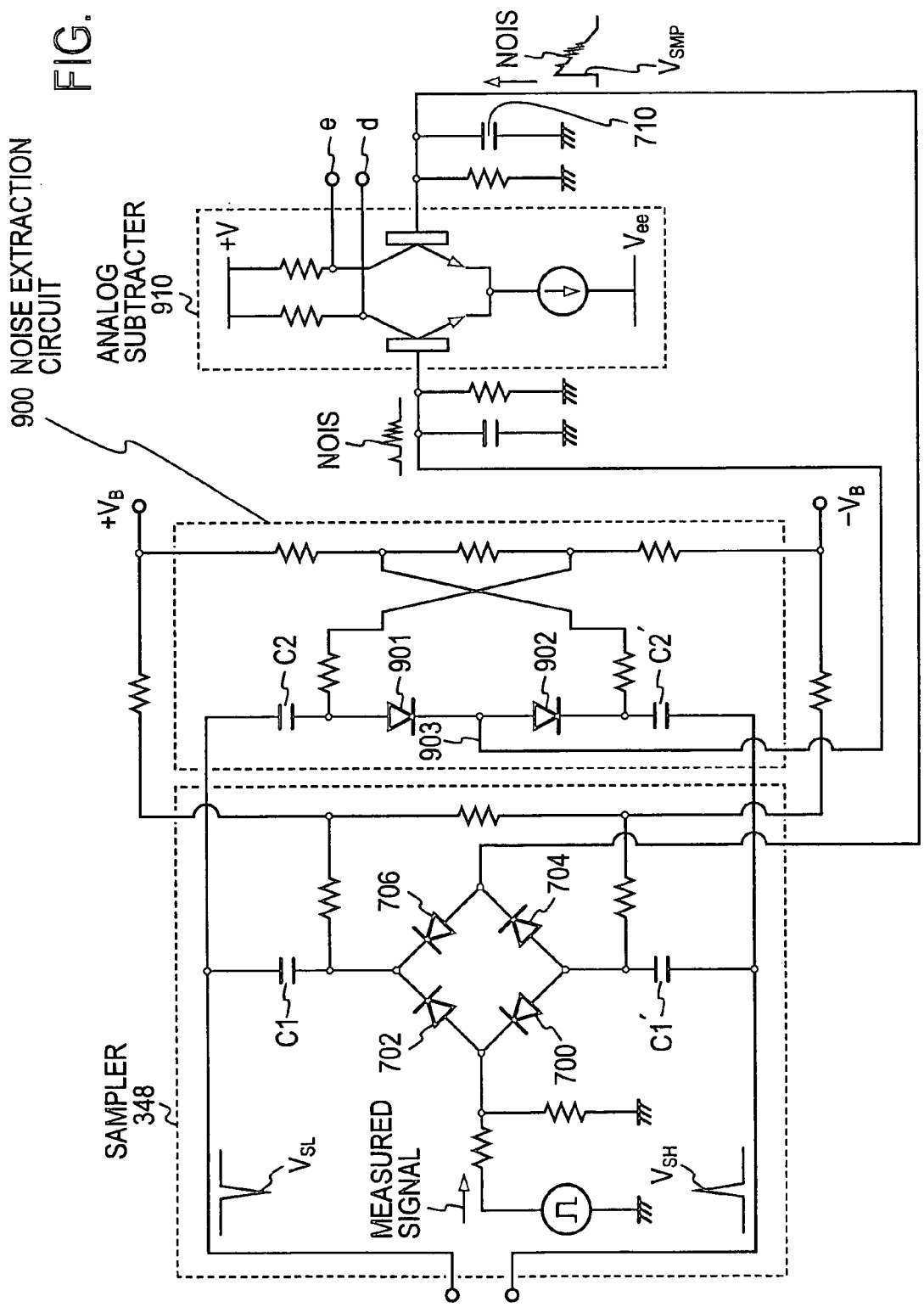
FIG. 10 is a connection diagram for describing a working example of a sampler having the noise removal capability of the present invention.
Figure 11A:
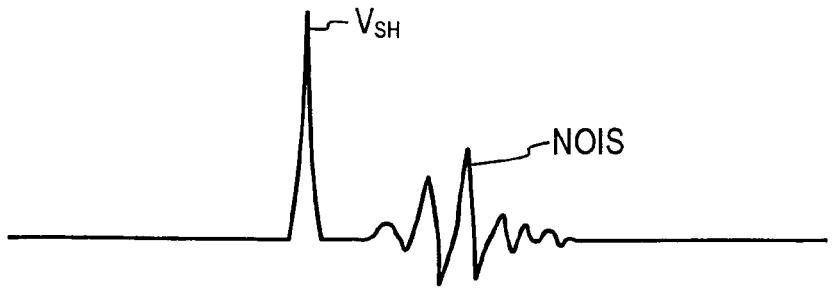
FIG. 11 is a waveform diagram for describing the operation of the sampler having noise removal capability shown in FIG. 10.
Figure 11B:
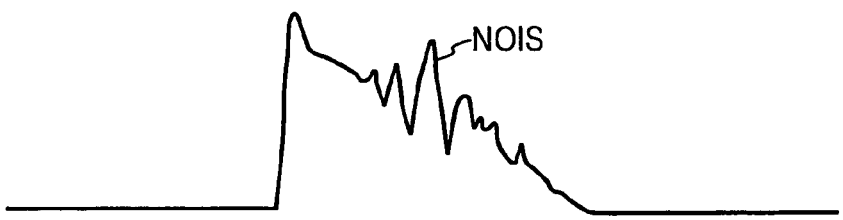
Figure 11C:
Figure 11D:
Figure 11E:

FIG. 10 shows a working example of the sampler 348 having noise removal capability. Strobe signals $V_{SL}$ and $V_{SH}$ having a narrow pulse width and a large amplitude are given in the sampler 348. A reflection or delay of a large-amplitude pulse having a narrow width caused by impedance-mismatched part or the like on the transmission channel produces a noise. Noise arrives immediately after the strobe signals $V_{SH}$ and $V_{SL}$. The diodes 700, 702, 704, and 706 constituting the switching circuit have already returned to the OFF state immediately after the strobe signals $V_{SH}$ and $V_{SL}$, but when noise is applied through the capacitors C1 and C1', this noise leaks out through the junction capacitance of the diodes 704 and 706 in the OFF state, the leaked noise arrives at a hold capacitor 710, and the sample voltage $V_{SMP}$ is caused to fluctuate.

Figure 15:
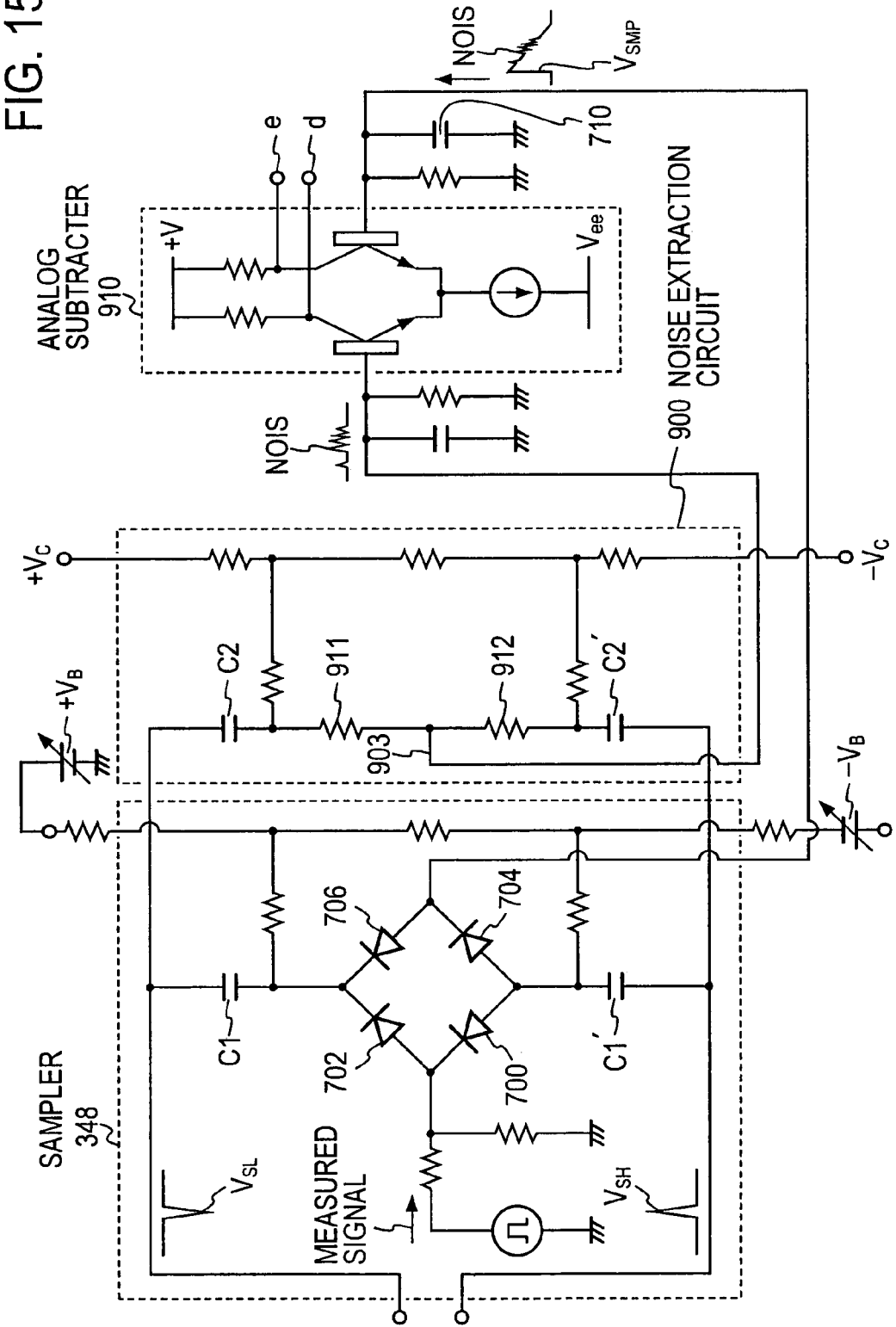
FIG. 15 is a connection diagram for describing yet another working example of the sampler having noise removal capability shown in FIG. 10.

In the present invention, a noise extraction circuit 900 is provided adjacent to the sampler 348 in order to remove the noise NOIS superimposed on the sample voltage $V_{SMP}$. In the working example shown in FIG. 10, the noise extraction circuit 900 is composed of a pair of diodes 901 and 902 connected in series and maintained in the OFF state by direct-current bias voltages, capacitors C2 and C2' for applying the strobe signals $V_{SL}$ and $V_{SH}$ to one and the other ends of the series connection, and an extraction line 903 for extracting noise from the junction of the diodes 901 and 902. Alternatively, as shown in FIG. 15, the noise extraction circuit 900 may be composed of a series circuit of resistors 911 and 912 instead of the diodes 901 and 902, each having a resistance value equal to the resistance value of the diodes 901 and 902 when OFF; capacitors C2 and C2' for applying the strobe signals $V_{SL}$ and $V_{SH}$ to one and the other ends of this series circuit; and an extraction line 903 for extracting noise from the junction of the resistors 911 and 912.

By the noise extraction circuit 900 shown in FIG. 10, when the strobe signals $V_{SL}$ and $V_{SH}$ are applied through the capacitors C2 and C2' to one and the other ends of the series circuit composed of the diodes 901 and 902 maintained in the OFF state, since the strobe signals $V_{SL}$ and $V_{SH}$ are mostly reverse in polarity to each other, the strobe signals cancel out each other, and do not appear in the extraction line 903. In contrast, there is no assurance that the component of the noise NOIS on the capacitor C2 side has a perfectly opposite polarity with respect to the component thereof on the capacitor C2' side. Therefore, components having a phase difference appear in the extraction line 903 and are extracted as noise. (The noise NOIS superimposed on the sample voltage $V_{SMP}$ also occurs in this manner.)

The noise NOIS superimposed on the sample voltage $V_{SMP}$ can be removed by inputting the noise NOIS extracted in this manner to one of the input terminals of an analog subtracter 910 composed of a differential amplifier, for example, and inputting the sample voltage $V_{SMP}$ to the other input terminal.

FIG. 11 shows the manner in which noise is removed. FIG. 11A shows the strobe signal, and in this example, the waveforms of $V_{SH}$ and the noise NOIS. FIG. 11B shows the sample voltage $V_{SMP}$ and the noise NOIS superimposed thereon. FIG. 11C shows the noise NOIS extracted from the noise extraction circuit 900. FIG. 11D shows the waveform of the output signal of one output terminal d of the differential amplifier constituting the analog subtracter 910; and FIG. 11E shows the waveform of the output signal of the other output terminal e. As is apparent from these waveforms, the noise NOIS can be removed on the output side of the analog subtracter 910, and the occurrence of error can be minimized in the comparison with the reference voltage in the comparator.

FIG. 12 shows a working example in which noise removal capability is added to the sampler 348 shown in FIG. 9B. In other words, this diagram shows a case in which the series circuit of the resistors 724 and 726 is connected in parallel to the switching circuit composed of the diodes 720 and 722, and the sample voltage $V_{SMP}$ is outputted from the junction of the resistors 724 and 726. The noise NOIS is superimposed on the sample voltage $V_{SMP}$ of the sampler 348 in the same way as in FIG. 10. Since the noise extraction circuit 900 is also the same as the one in FIG. 10, the operation and effects of the circuit shown in FIG. 12 are the same as those of the circuit shown in FIG. 10. However, the resistance values selected for the resistors 724 and 726 are about equal to the resistance values of the diodes 720 and 722 when in OFF state.

FIG. 13 shows yet another working example of the sampler 348 having noise removal capability. In the working example shown in FIG. 13, the bias voltage sources for the sampler 348 are separated from the bias voltage sources for the noise extraction circuit 900, and a case is shown in this example in which the voltage of the bias voltage sources $+V_C$ and $-V_C$ for the noise extraction circuit 900 can be adjusted. By this configuration, the bias voltage sources $+V_C$ and $-V_C$ of the noise extraction circuit 900 are separated from the bias voltage sources $+V_B$ and $-V_B$ of the sampler 348, and the voltages thereof are made adjustable, whereby the reverse bias voltages applied to the diodes 901 and 902 constituting the noise extraction circuit 900 can be independently adjusted. As a result, the junction capacitance of each diodes 901 and 902 can be freely adjusted, and the amplitude of the extracted noise NOIS can be adjusted. As a result, effects are obtained whereby the amplitude of the extracted noise NOIS can be matched with the amplitude of the noise NOIS superimposed on the sample voltage $V_{SMP}$, and the degree of noise NOIS removal can be increased.

Figure 14:
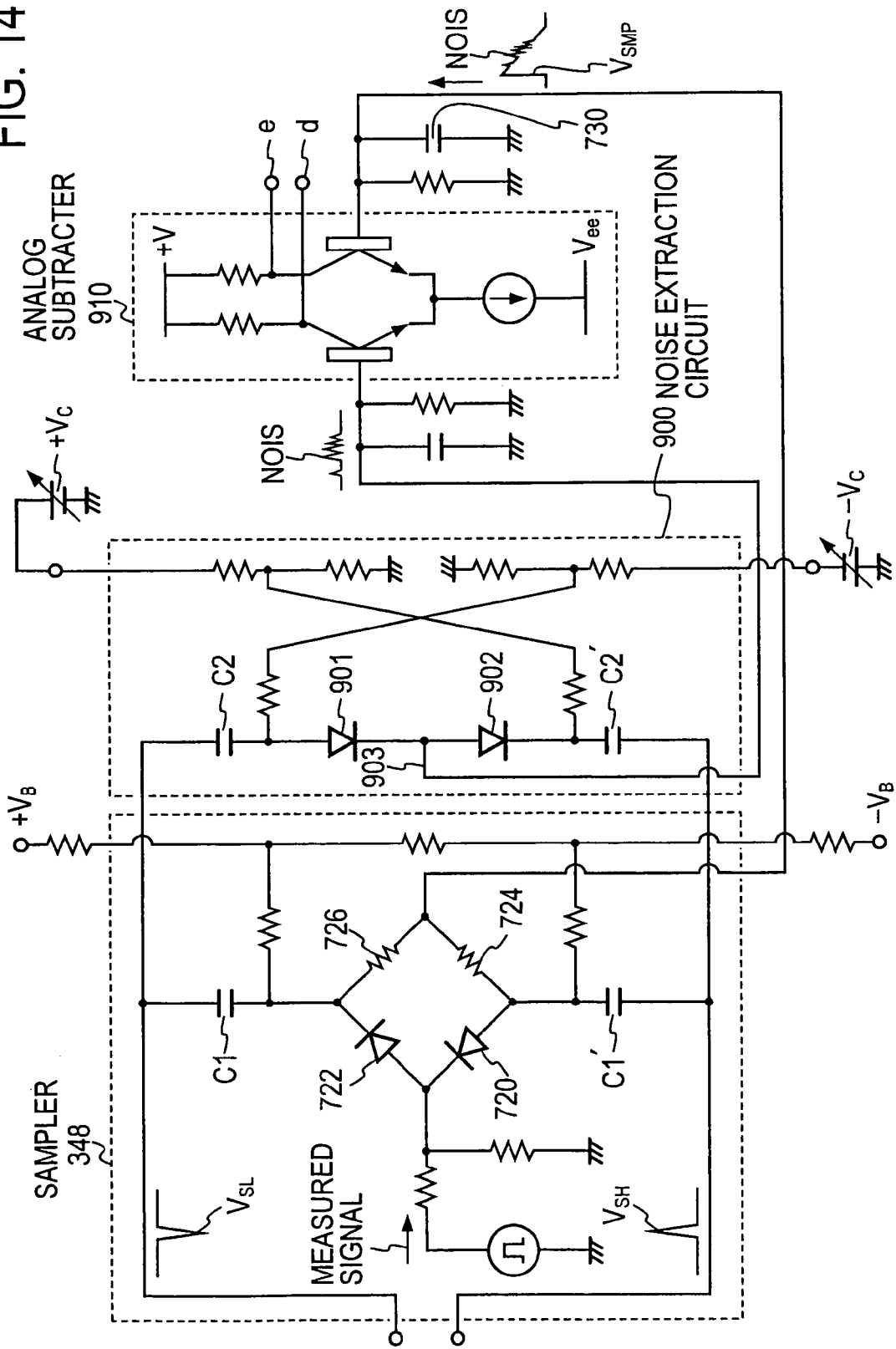
FIG. 14 is a connection diagram for describing yet another working example of the sampler having noise removal capability shown in FIG. 10.

FIG. 14 shows a case in which the sampler 348 is structured like the sampler shown in FIG. 9B. The bias voltage sources $+V_C$ and $-V_C$ of the noise extraction circuit 900 are also independently adjustable in this case, and the amplitude of the extracted noise is also adjustable.

FIG. 15 shows a case in which the bias voltage sources $+V_B$ and $-V_B$ of the sampler 348 are adjustable, the reverse bias voltages applied to the four diodes 700, 702, 704, and 706 constituting the switching circuit are adjusted, the amplitude of the noise NOIS superimposed on the sample voltage $V_{SMP}$ is adjusted and matched with the amplitude of the noise NOIS extracted from the noise extraction circuit 900 to enhance the degree of noise removal. In the working example shown in FIG. 15, a case is shown in which resistors 911 and 912 having resistance values equal to the resistance values of the diodes 901 and 902 when in OFF state are used in the noise extraction circuit 900 instead of the diodes 901 and 902 controlled to the OFF state by a reverse bias voltage. Even when this configuration is adopted, the noise NOIS that arises immediately after application of the strobe signals $V_{SL}$ and $V_{SH}$ can be extracted in the extraction line 903, and the noise NOIS superimposed on the sample voltage $V_{SMP}$ can be removed using the extracted noise NOIS.

Figure 16:
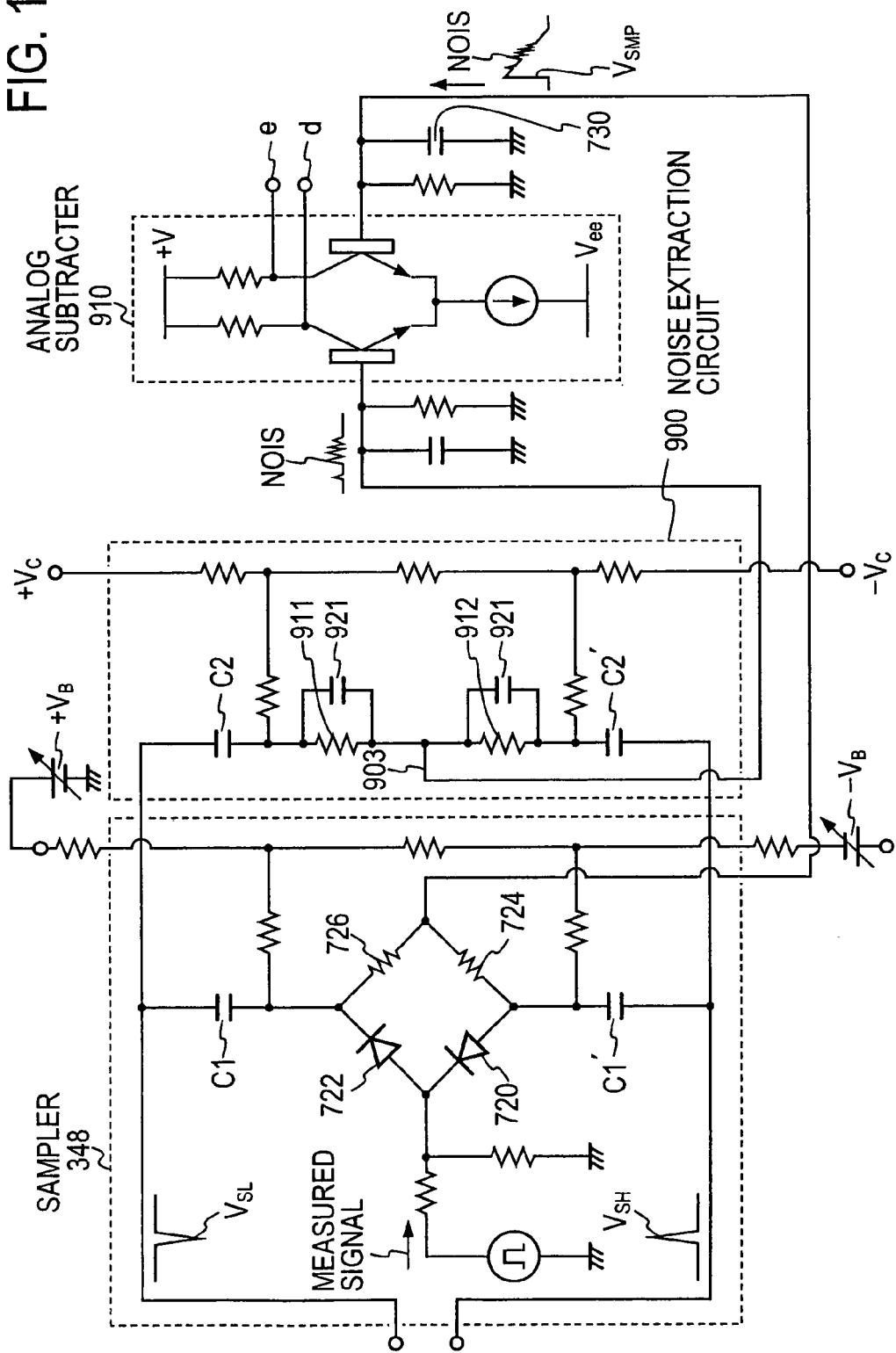
FIG. 16 is a connection diagram for describing yet another working example of the sampler having noise removal capability shown in FIG. 10.

FIG. 16 shows a case in which the switching circuit of the sampler 348 is composed of diodes 720 and 722, and resistors 724 and 726; the bias voltage sources $+V_B$ and $-V_B$ applied to the diodes 720 and 722 are adjustable voltage sources; and the noise extraction circuit 900 is constructed such that micro-capacity capacitors 921 and 922 having about the same capacitance as the junction capacitance of the diodes are connected in parallel to the resistors 911 and 912.

The configuration of the sampler 348 is as described in FIG. 14, and is the same as described in FIGS. 14 and 15 in that the reverse bias voltage sources $+V_B$ and $-V_B$ applied to the diodes 720 and 722 are adjustable voltage sources; the amplitude is matched with that of the noise extracted by the noise extraction circuit 900 to enhance the degree of noise removal. A characteristic feature in FIG. 16 is that the resistors 911 and 912 used instead of the diodes 901 and 902 in the noise extraction circuit 900 are connected in parallel to the capacitors 921 and 922, respectively. The response characteristics of the noise extraction circuit 900 can be enhanced by selecting an appropriate value for the capacity of the capacitors 921 and 922 according to the frequency characteristics of the noise. The degree of noise removal can be even further enhanced by enhancing the response characteristics.

Figure 17:
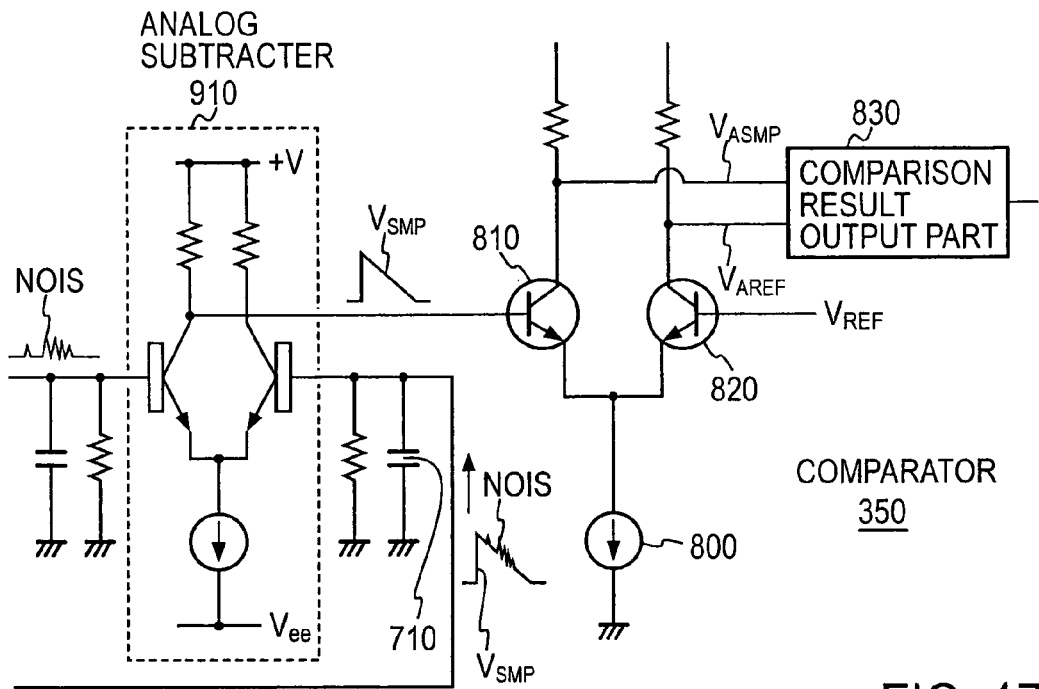
FIG. 17 is a connection diagram showing an example of the structure of the comparator 350.

FIG. 17 shows an example of the comparator 350. The comparator 350 is composed of a current source 800, a sample voltage transistor 810, a reference voltage transistor 820, and a comparison result output part 830. The current source 800 generates electric currents on the emitter sides of the sample voltage transistor 810 and reference voltage transistor 820. Upon application of the sample voltage $V_{SMP}$ to the base, the sample voltage transistor 810 generates at its collector a voltage $V_{AREF}$ as a result of amplification of the sample voltage $V_{SMP}$. Upon application of the reference voltage $V_{REF}$ to the base, the reference voltage transistor 820 generates at its collector a voltage $V_{AREF}$ as a result of amplification of the reference voltage $V_{REF}$. The comparison result output part 830 compares the amplified sample voltage $V_{ASMP}$ with the amplified reference voltage $V_{AREF}$, and outputs a comparison result indicating whether the amplified sample voltage $V_{ASMP}$ is higher than the amplified reference voltage $V_{AREF}$ or not.

Instead of a comparator circuit composed solely of a comparator, the calibration apparatus 340 according to the present embodiment has a comparator circuit 342 composed of a comparator 350 and a sampler 348 that includes a high-speed switching circuit and capacitors. By this configuration, the effects of equivalent rise time due to bandwidth inadequacy of the comparator, the effects of fluctuations in the response time of the comparator according to the overdrive voltage, or other effects which decrease the precision of the comparison of the reference voltage with the voltage of the test signal can be prevented, and more accurate calibration can be performed.

Figure 18:
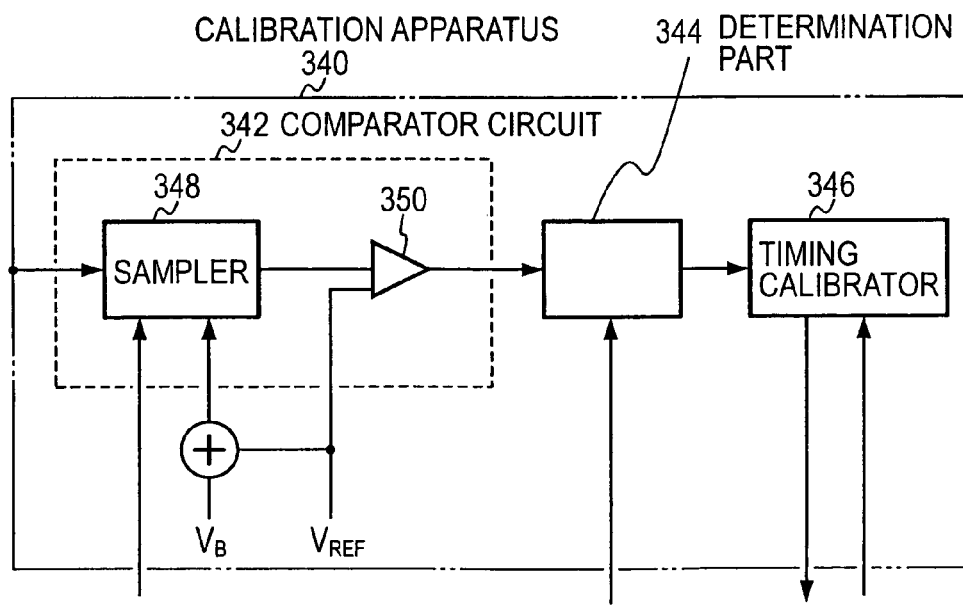
FIG. 18 is a block diagram showing an example of the structure of the calibration apparatus according to a modification of the first embodiment of the present invention.

FIG. 18 shows an example of the structure of the calibration apparatus 340 according to a modification of the first embodiment of the present invention. The calibration apparatus 340 has a comparator circuit 342, a determination part 344, and a timing calibration part 346. Since the calibration apparatus 340 has substantially the same structure and function as the calibration apparatus 340 shown in FIG. 3, description thereof is omitted except for the aspects in which these structures and functions differ.

The comparator circuit 342 is composed of a sampler 348 and a comparator 350. The sampler 348 samples the test signal at the timing indicated by the delayed strobe signal, and outputs a sample voltage of the test signal to the comparator 350. The sampler 348 outputs the reference voltage $V_{REF}$ as the sample voltage when the switching circuit is OFF by superimposing the reference voltage $V_{REF}$ onto the reverse bias voltage $V_B$ of the diodes in the switching circuit. The comparator 350 compares the sample voltage outputted by the sampler 348 with the reference voltage $V_{REF}$, and outputs a comparison result indicating whether or not the sample voltage is higher than the reference voltage to the determination part 344.

Figure 19:
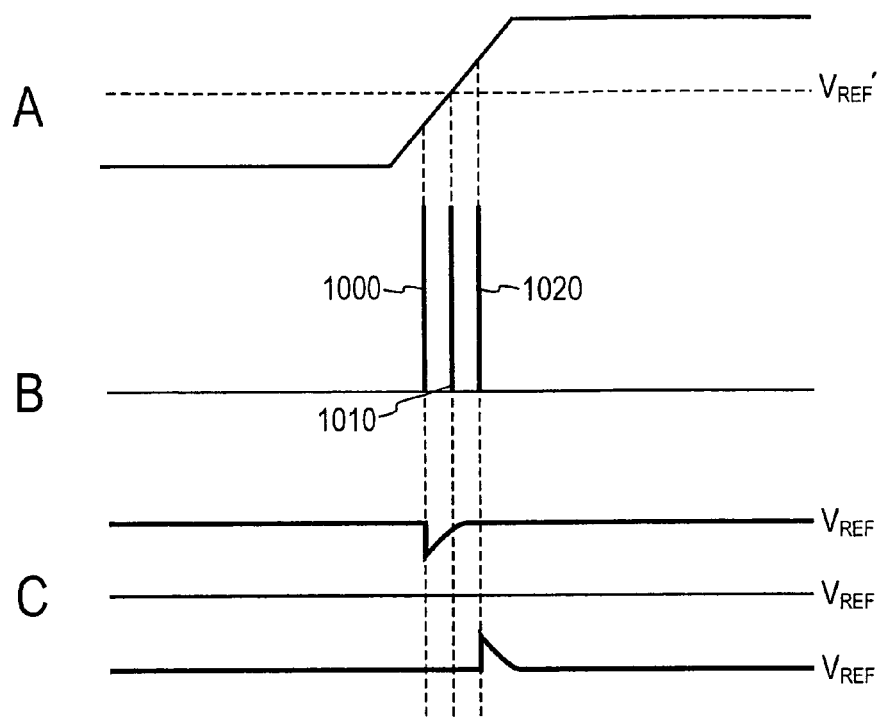
FIG. 19 is a block diagram showing an example of the structure of the sample voltage in the calibration apparatus according to a modification of the first embodiment of the present invention.

FIG. 19 shows an example of the sample voltage in the calibration apparatus 340 according to a modification of the first embodiment of the present invention. FIG. 19A shows an example of the waveform of the test signal inputted to the sampler 348. FIG. 19B shows an example of the waveform that is the composite of the waveforms of strobe signals generated at different timings. FIG. 19C shows an example of the sample voltage that corresponds to each of the strobe signals generated at different timings.

When the switching circuit in the sampler 348 is in the OFF state, the sampler 348 outputs the reference voltage $V_{REF}$ as the sample voltage. The sampler 348 outputs a sample voltage that is below the reference voltage $V_{REF}$ when the test signal is sampled at the timing indicated by the strobe signal 1000. When the test signal is sampled at the timing indicated by the strobe signal 1010, the sampler 348 outputs a sample voltage that matches the reference voltage $V_{REF}$. The sampler 348 outputs a sample voltage that is above the reference voltage $V_{REF}$ when the test signal is sampled at the timing indicated by the strobe signal 1020. The comparator 350 determines whether the sample voltage of the test signal in the timing indicated by the strobe signal is high or low with respect to the reference voltage $V_{REF}$ according to whether the pulse is generated in the positive or negative direction from the perspective of the reference voltage $V_{REF}$ in the sample voltage.

By the calibration apparatus 340 according to the present modification, the comparator 350 can determine comparison of the sample voltage and the reference voltage according to the direction of the pulse generated in the sample voltage. The calibration apparatus 340 can thereby reduce linearity error in the comparator 350 and perform calibration with higher precision.

Figure 20:
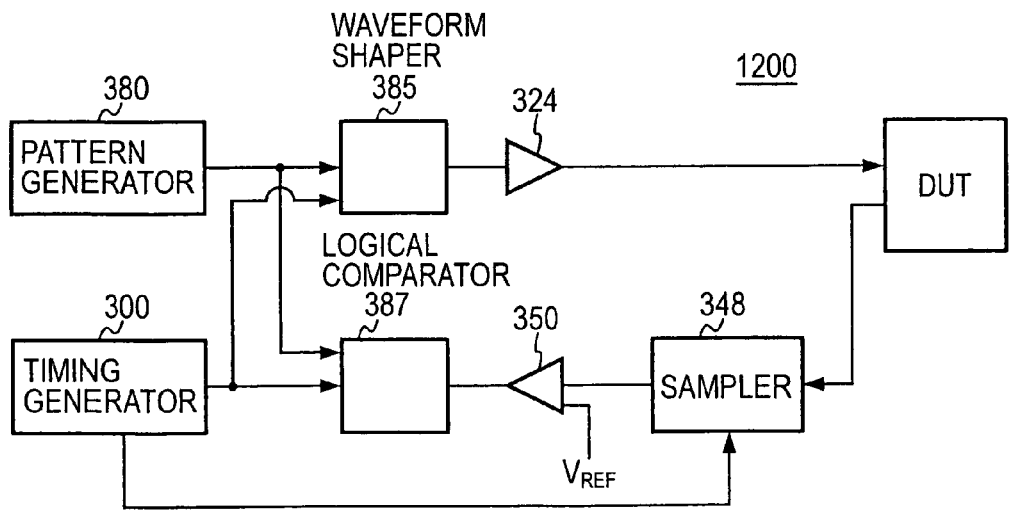
FIG. 20 is a block diagram showing an example of the overall structure of the testing apparatus according to a second embodiment of the present invention.

FIG. 20 shows an example of the overall structure of the testing apparatus 1200 according to a second embodiment of the present invention. The testing apparatus 1200 generates a test signal and applies the test signal to the DUT, compares an expected value with the output signal outputted as a result of the operation of the DUT based on the test signal, and determines the quality of the DUT. An object in the testing apparatus 1200 according to the present embodiment is to increase the precision with which the output signal outputted by the DUT is compared with the expected value.

The testing apparatus 1200 is provided with a pattern generator 380, a timing generator 300, a waveform shaper 385, a driver 324, a sampler 348, a comparator 350, and a logical comparator 387. The pattern generator 380 generates a test pattern indicating the pattern of the test signal applied to the DUT, and an expected value pattern indicating the pattern of the expected value with which the output signal outputted by the DUT is compared. The timing generator 300 generates a timing signal indicating the timing at which the test signal is applied to the DUT. The timing generator 300 also generates a strobe signal in relation to the timing signal indicating the timing for detecting the output signal outputted by the DUT.

The waveform shaper 385 reshapes the waveform of the test signal based on the test pattern generated by the pattern generator 380 and the timing indicated by the timing signal generated by the timing generator 300, and outputs the result to the driver 324. The driver 324 acquires the waveform of the test signal reshaped by the waveform shaper 385, and applies the test signal to the DUT.

The sampler 348 samples the analog output signal, outputted from the DUT according to the test signal applied to the DUT by the driver 324, at a predetermined timing; specifically, at the timing indicated by the strobe signal outputted by the timing generator 300, and outputs the sample voltage of the output signal to the comparator 350. The comparator 350 compares the sample voltage outputted by the sampler 348 with an analog reference voltage $V_{REF}$, and outputs to the logical comparator 387 a comparison result indicating whether the sample voltage is higher than the reference voltage $V_{REF}$. The logical comparator 387 detects the comparison result outputted by the comparator 350 at the timing indicated by the strobe signal generated by the timing generator 300, and determines the quality of the DUT by comparing the comparison result thus detected with the expected value pattern generated by the pattern generator 380.

By the testing apparatus 1200 according to the present embodiment, the output signal outputted by the DUT is sampled by the sampler 348, and the sample voltage is compared with the reference voltage by the comparator 350. By this configuration, the effects of equivalent rise time due to bandwidth inadequacy of the comparator, the effects of fluctuations in the response time of the comparator according to the overdrive voltage, or other effects which decrease precision in receiving the output signal can be prevented, and more precise testing can be performed.

The present invention was described above using embodiments, but the technological scope of the present invention is not limited by the ranges described in the abovementioned embodiments. It is clear to one skilled in the art that various modifications or improvements can be made to the abovementioned embodiments. It is also apparent from the claims that embodiments to which such modifications or improvements are added may also be included in the technological scope of the present invention.

INDUSTRIAL APPLICABILITY

The comparator circuit, calibration apparatus, testing apparatus, and calibration method according to the present invention are applicable in various semiconductor manufacturing processes and the like.

The invention claimed is:

1. A comparator circuit that comprises:
   a sampler having a capacitor, said sampler sampling a measured signal by using a strobe pulse signal and its inversed strobe pulse signal that are both generated at a predetermined timing and applied thereto and outputting a sample voltage having a value of said measured signal at the predetermined timing charged in capacitor; and
   a comparator for comparing said sample voltage received from the capacitor of the sampler with a reference voltage and outputting a comparison result indicating whether said sample voltage is higher than said reference voltage;
   wherein
      said sampler comprises
         a diode-bridge switching circuit,
         a strobe pulse applying circuit and
         a capacitor;
      said diode-bridge switching circuit comprises
         an input side pair of diodes and
         an output side pair of diodes;

the input side pair of diodes are connected in series with an input terminal at a junction therebetween to which the measured signal is applied;

the output side pair of diodes are connected in series with an output terminal at a junction therebetween to which the capacitor is connected;

a series connection of the input side pair of diodes and a series connection of the output side pair of diodes are connected in parallel between first and second terminals to which a reverse bias voltage is supplied so that the diode bridge switching circuit is normally maintained in an OFF state; and the strobe pulse signal applying circuit applies the strobe pulse signal and the inversed strobe pulse signal to the first and second terminals to render the diode bridge switching circuit in an ON state so that a value at the predetermined timing of the measured signal applied to the input terminal is derived from the output terminal and charged in the capacitor as a sample voltage of the measured signal.

2. A comparator circuit that comprises a sampler having a capacitor, said sampler sampling a measured signal by using a strobe pulse signal and its inversed strobe pulse signal that are both generated at a predetermined timing and applied thereto and outputting a sample voltage having a value of said measured signal at the predetermined timing charged in the capacitor;

a comparator for comparing said sample voltage received from the capacitor of the sampler with a reference voltage and outputting a comparison result indicating whether said sample voltage is higher than said reference voltage;

a noise extraction circuit for extracting noise components superimposed on the sample voltage that follow the strobe pulse signal and the inversed strobe pulse signal; and an analog subtraction circuit for performing analog subtraction of the noise components extracted by the noise extraction circuit from the sample voltage so that the noise components superimposed on said sample voltage are removed and the comparator compares the resulting sample voltage with the reference voltage.

3. The comparator circuit according to claim 2, wherein said noise extraction circuit comprises a series connection of a pair of diodes for the noise extraction circuit with an output terminal at a junction therebetween and maintained in the OFF state by a reverse bias voltage applied to the series connection of the pair of diodes; and an extraction line connected to the output terminal, wherein a strobe pulse signal applying circuit applies the strobe pulse signal and the inversed strobe pulse signal to the pair of diodes; and the noise components are extracted from the output terminal to the extraction line.

4. The comparator circuit according to claim 2, wherein said noise extraction circuit comprises a pair of resistors connected in series with an output terminal at a junction therebetween and each having a resistance value equivalent to an OFF resistance value of one of the diodes; and an extraction line connected to the output terminal, wherein a strobe pulse signal applying circuit applies the strobe pulse signal and the inversed strobe pulse signal to the pair of resistors; and the noise components are extracted from the output terminal to the extraction line.

5. The comparator circuit according to any one of claims 2 through 4 that comprises a voltage adjusting means for varying the reverse bias voltage applied to the noise extraction circuit to adjust the amplitude of the noise components extracted via said extraction line.

6. The comparator circuit according to claim 4, wherein a capacitor having a capacitance equivalent to the junction capacitance of the diodes is connected in parallel to each of the pair of series-connected resistors constituting said noise extraction circuit.

7. The comparator circuit according to any one of claims 1 through 4, wherein said comparator comprises:

a sample voltage transistor for amplifying said sample voltage;

a reference voltage transistor for amplifying said reference voltage; and a comparison result output part for comparing said amplified sample voltage with said amplified reference voltage and outputting a comparison result indicating whether said amplified sample voltage is higher than said amplified reference voltage.

8. A calibration apparatus for acquiring a measured signal outputted by a driver and calibrating the output timing of said measured signal from said driver, said calibration apparatus comprising:

a sampler for sampling said measured signal at a predetermined timing and outputting the sample voltage of said measured signal;

a comparator for comparing said sample voltage with a reference voltage and outputting a comparison result indicating whether said sample voltage is higher than said reference voltage;

a determination part for determining that said sample voltage matches said reference voltage at a timing at which said comparison result changes as said timing of sampling is varied by said sampler; and a timing calibration part for calibrating the output timing of said measured signal from said driver based on said timing at which it is determined in said determination part that said sample voltage matches said reference voltage.

9. A testing apparatus for testing a device under test; said testing apparatus comprising:

a timing generator for generating a timing signal that indicates timing at which a test signal is applied to each of a plurality of terminals provided to said device under test;

a plurality of timing delay units for delaying said timing signals;

a plurality of drivers provided so as to correspond with each of said plurality of timing delay units, for applying said test signal to each of said plurality of terminals at the timing indicated by each of said timing signals delayed by each of said plurality of timing delay units;

a sampler for sampling said test signal outputted, at a predetermined timing, by the corresponding driver for each of said plurality of drivers, and outputting the sample voltage of said test signal;

a comparator for comparing said sample voltage with a reference voltage and outputting a comparison result indicating whether said sample voltage is higher than said reference voltage;

a determination part for determining that said sample voltage matches said reference voltage at a timing at which said comparison result changes as said timing of sampling is varied by said sampler; and a timing calibration part for calibrating the delay time caused in said timing signal by at least one of said plurality of timing delay units based on said timing at which it is determined in said determination part that said sample voltage matches said reference voltage for each of said plurality of drivers, in order to synchronize the timing at which said rest signal outputted by each of said plurality of drivers is applied to the device under test.

10. The testing apparatus according to claim 9, wherein said timing generator also generates a strobe signal in relation to said timing signal, for indicating said dining at which said sampler performs sampling, and the timing at which said determination part detects said comparison results.

11. The testing apparatus according to claim 10, further comprising:

a frequency divider for frequency-dividing said strobe signal; and a strobe delay unit for delaying said strobe signal frequency-divided in said frequency divider; wherein said determination part determines that said sample voltage matches said reference voltage in said delay time by which said comparison result is changed when a change is induced in the delay time by which said strobe delay unit delays said strobe signal; and said timing calibration part calibrates the delay time caused in said timing signal by at least one of said plurality of timing delay units based on the delay time of said strobe signal at which it is determined in said determination part that said sample voltage matches said reference voltage for each of said plurality of drivers, in order to synchronize the timing at which said rest signal outputted by each of said plurality of drivers is applied to the device under test.

12. The testing apparatus according to claim 11, further comprising:

a reference voltage controller for changing said reference voltage with which said comparator compares said sample voltage of said test signal, in order to acquire a voltage at the timing indicated by said delayed strobe signal in said test signal outputted by each of said plurality of drivers;

a waveform acquisition part for acquiring the waveform of said test signal outputted by each of said plurality of drivers, by changing the delay time for delaying said strobe signal by said strobe delay unit, and by changing said reference voltage by said reference voltage controller; and a test signal correction part for correcting the signal outputted by the corresponding driver so that the desired said test signal is applied to said device under test based on the waveform of said test signal outputted by each of said plurality of drivers acquired by said waveform acquisition part.

13. A calibration method for acquiring a test signal outputted by each of a plurality of drivers provided in a testing apparatus for testing a device under test and calibrating the output timing of said test signal from each of said plurality of drivers; said calibration method comprising:

a timing generation step for generating a timing signal that indicates timing at which said test signal is applied to each of a plurality of terminals of said device under test;

a timing delay step for delaying said timing signals and outputting a plurality of delayed timing signals;

a test signal outputting step whereby said plurality of drivers each output said test signal at the timing indicated by each of said plurality of delayed timing signals;

a sampling step for sampling at a predetermined timing said test signal outputted by the corresponding driver and outputting the sample voltage of said test signal for each of said plurality of drivers;

a comparison step for comparing said sample voltage with a reference voltage and outputting a comparison result indicating whether said sample voltage is higher than said reference voltage;

a determination step for determining that said sample voltage matches said reference voltage when said comparison result changes as said timing at which said test signal is sampled in said sampling step is changed; and a timing calibration step for calibrating the delay time caused in said timing signal by at least one of said plurality of timing delay units provided so as to correspond to each of said plurality of drivers, based on said timing at which it is determined in said determination step that said sample voltage matches said reference voltage for each of said plurality of drivers, in order to synchronize the timing at which said test signal outputted by each of said plurality of drivers is applied to the device under test.

14. The comparator circuit according to claim 5, wherein said comparator comprises:

a sample voltage transistor for amplifying said sample voltage;

a reference voltage transistor for amplifying said reference voltage; and a comparison result output part for comparing said amplified sample voltage with said amplified reference voltage and outputting a comparison result indicating whether said amplified sample voltage is higher than said amplified reference voltage.

15. The comparator circuit according to claim 6, wherein said comparator comprises:

a sample voltage transistor for amplifying said sample voltage;

a reference voltage transistor for amplifying said reference voltage; and a comparison result output part for comparing said amplified sample voltage with said amplified reference voltage and outputting a comparison result indicating whether said amplified sample voltage is higher than said amplified reference voltage.

16. A comparator circuit comprising:

a sampler that comprises
a diode bridge switching circuit, and
a strobe pulse signal applying circuit; and a comparator; wherein
the diode bridge switching circuit supplied with the measured signal at an input terminal thereof is normally maintained in an OFF state by a reverse bias voltage supplied thereto and rendered in an ON state by a strobe pulse signal and its inversed strobe pulse signal, which are both generated at a predetermined timing and applied thereto from a strobe pulse signal applying circuit, and outputs at an output terminal thereof a sample voltage having a value of the measured signal at the predetermined timing; and the comparator compares the sample voltage outputted from the sampler with a reference voltage and outputs a comparison result indicating whether the sample voltage is higher than the reference voltage.

17. A comparator circuit that comprises:

a sampler having a capacitor, said sampler sampling a measured signal by using a strobe pulse signal and its inversed strobe pulse signal that are both generated at a predetermined timing and applied thereto and outputting a sample voltage having a value of said measured signal at the predetermined timing charged in the capacitor; and a comparator for comparing said sample voltage received from the capacitor of the sampler with a reference voltage and outputting a comparison result indicating whether said sample voltage is higher than said reference volume;

wherein:
  the sampler comprises
    a diode bridge switching circuit,
    a strobe pulse signal applying circuit, and
    a capacitor,
  the diode bridge switching circuit comprises
    an input side pair of diodes, and
    an output side pair of resistors;
  the input side pair of diodes are connected in series with an input terminal at a junction therebetween to which the measured signal is applied;
  the output side pair of resistors are connected in series with an output terminal at a junction therebetween to which the capacitor is connected;
  a series connection of the input side pair of diodes and a series connection of the output side pair of resistors are connected in parallel between first and second terminals to which a reverse bias voltage is supplied so that the diode bridge switching circuit is normally maintained in an OFF state; and
  the strobe pulse signal applying circuit applies the strobe pulse signal and the inversed strobe pulse signal to the first and second terminals to render the diode bridge switching circuit in an ON state so that a value at the predetermined timing of the measured signal applied to the input terminal is derived from the output terminal and charged in the capacitor as a sample voltage of the measured signal.

18. The comparator circuit according to claim 1 or 17, wherein the sampler comprises a voltage adjusting means far varying the reverse bias voltage applied to the diode bridge switching circuit to adjust the amplitude of noise components superimposed on the sample voltage.

* * * * *